United States Patent [19]

Nambu et al.

[11] Patent Number: 5,086,414
[45] Date of Patent: Feb. 4, 1992

[54] SEMICONDUCTOR DEVICE HAVING LATCH MEANS

[75] Inventors: Hiroaki Nambu, Hachioji; Noriyuki Homma, Kodaira; Kunihiko Yamaguchi, Sayama; Kazuo Kanetani, Kokubunji; Youji Idei, Asaka; Kenichi Ohhata; Yoshiaki Sakurai, both of Kokubunji; Jun Etoh, Hachioji, all of Japan

[73] Assignees: Hitachi, Ltd., Tokyo; Hitachi Device Engineering Co., Ltd., Mobara, both of Japan

[21] Appl. No.: 436,770

[22] Filed: Nov. 15, 1989

[30] Foreign Application Priority Data

Nov. 17, 1988 [JP] Japan .................................. 63-288841
Dec. 21, 1988 [JP] Japan .................................. 63-320379

[51] Int. Cl.⁵ .............................................. G11C 8/00
[52] U.S. Cl. ................................ 365/230.08; 365/233
[58] Field of Search ..................... 365/230.08, 230.06, 365/233, 189.05

[56] References Cited

U.S. PATENT DOCUMENTS 4,541,075  9/1985  Dill et al. ..................... 365/230.05
4,685,088  8/1987  Iannucci ...................... 365/230.08

Primary Examiner—Joseph A. Popek
Attorney, Agent, or Firm—Antonelli, Terry Stout & Kraus

[57] ABSTRACT

A semiconductor circuit having a plurality of circuit blocks, each having latch circuits each one thereof being controlled by an internally provided clock signal for preventing malfunction of the circuit. Each circuit is provided with the latch function so that the cycle time is made shorter than the access time. Moreover, the latch means are driven in such a manner that the adjoining ones are prevented from being put to through-state simultaneously, whereby malfunction is prevented.

29 Claims, 34 Drawing Sheets

SEMICONDUCTOR DEVICE HAVING LATCH MEANS

BACKGROUND OF THE INVENTION

The present invention relates to semiconductor integrated circuits and, more particularly, to a memory structure and an operate method suitable for a memory which needs operating at high-speed operating cycle time.

The present invention further relates to a memory LSI suitable for use in a pipelined memory incorporating a plurality of latch circuits in a memory chip and to a digital system using such a memory LSI.

There are known techniques of providing latch circuits in circuit blocks of a memory LSI chip: Japanese Patent Laid-Open No. 128097/1983 discloses the art of using address and clock signal buffers as latch circuits.

Japanese Patent Laid-Open No. 250584/1987 discloses the art of increasing a read cycle speed by controlling latch timing of respective latch circuits provided in an address latch circuit and an output data latch circuit.

Japanese Patents Laid-Open Nos. 250583/1987, 70996/1988 disclose the art of increasing a write cycle speed by providing an address latch circuit and a latch circuit for latching a write control signal.

However, all of the aforementioned prior arts are incapable of providing a read cycle time that is far shorter than the delay time (i.e. access time) of a signal from an address latch circuit up to an output data latch circuit and of providing a write cycle time that is far shorter than the sum of the delay time of a signal from a latch circuit for latching a write control signal up to a memory cell and the switching time of the memory cell.

SUMMARY OF THE INVENTION

A limit has been placed upon any attempt to increase a drive cycle speed in the conventional memory because there is provided only a two-stage latch circuit in the signal path. It is therefore only necessary to add another stage of a latch circuit (hereinafter called an internal latch circuit) in the vicinity of a location where the delay time of the signal becomes just half the access time within the signal path between the address latch circuit and the output data latch circuit so as to increase the read cycle speed. In this way, the read cycle time can be made substantially half the access time because the delay time of the signal from the address latch circuit up to the internal latch circuit and the delay time of the signal from the internal latch circuit up to the output data latch circuit become substantially half the access time, respectively.

In other words, it is extremely effective for the circuit block of the memory to be reduced into latch circuits as much as possible to increase the memory drive cycle speed by dividing the signal path between the address input terminal up to the data output terminal and the signal path between the write control signal input terminal up to the memory cell into latch circuits. In the ordinary memory, the cycle time, i.e. the time ranging from the initiation of access to the memory up to that of the next access thereto can never be made shorter than the access time. If many circuits in the LSI are reduced into latch circuits to make them perform the so-called pipelined operation, the high-speed (short cycle time) operation of the memory becomes possible as they can be operated at a cycle time slightly greater than the delay time between latch circuits.

A memory in which the signal path is divided into latch circuits so as to increase drive cycle speed is hereinafter called a pipelined memory.

In order to materialize such a pipelined memory, the present inventors have already proposed a device in which a latch circuit is incorporated into a word line (or bit line) driver of a memory (U.S. Pat. Application No. 277,261 filed Nov. 29, 1988, now U.S. Pat. No. 4,986,666) and another in which a latch circuit is incorporated into a sense circuit of a memory.

If such a driver or sense circuit incorporating a latch circuit is provided within a signal path between an address latch circuit up to an output data latch circuit, a memory shown in FIG. 1 may be formed. In FIG. 1, the memory comprises address signal input terminals A0, A1, a clock signal input terminal CLK, a data output terminal DO, and latch circuits LT in the form of a D-type flip flop. Two latch circuits LT in an address buffer 1 constitute a first stage; four latch circuits LT in a driver 3 constitute a second stage; a latch circuit LT in a sense circuit 5 forms a third stage; and a latch circuit LT in an output circuit 6 forms a fourth stage. The memory further comprises data input terminals Di (i=1-4) of the respective latch circuits, data output terminals Q, and clock signal input terminals CK for controlling the through-state and hold-state of the latch circuit. Any terminals provided with the symbol CK in the drawings of this specification represent latch circuits which are put to the through-state when the clock signal is at a H level, whereas those provided with the symbol $\overline{CK}$ therein represent latch circuits put to the through-state when the clock signal is at an L level.

FIG. 2 shows an example of a signal waveform chart illustrating a waveform at each node of FIG. 1. In FIG. 2, the cycle of the clock signal CLK and the holding time of the H level are set at 1.0 ns and 0.3 ns, respectively. Moreover, the delay time of the signal in the circuit block is assumed to be as follows: the delay time from the address buffer 1 up to the driver 3 to be 0.4 ns; the delay time from the driver 3 up to the sense circuit 5, 0.7 ns; the delay time from the sense circuit 5 up to the output circuit 6, 0.4 ns; and the delay time within the output circuit 6, 0.5 ns.

In the aforementioned circuit, the clock signal CLK is switched to the H level at 0.0 ns. When all the latch circuits are put to the through-state, for instance, the input signal $D_2$ of the driver is switched to the H level 0.4 ns later, i.e. at 0.4 ns in compliance with the input signal $D_1$ of the address buffer at the H level. The input signal $D_1$ is an address signal in this case and decoded by a decoder 2, whereas its output signal is applied to $D_2$. When the input signal $D_1$ is at the H level, the input signal $D_2$ is not always at the H level. Notwithstanding, both are assumed at the H level for convenience of illustration. At 0.3 ns, the clock signal CLK is switched to the L level and all the latch circuits are put to the hold-state. However, the address buffer 1, for instance, keeps outputting the H level in compliance with the input signal $D_1$ of the address buffer at the H level and therefore exerts no influence upon the input signal $D_2$ of the driver.

At 1.0 ns subsequently, the clock signal CLK is switched to the H level again and, when all the latch circuits are put to the through-state again, an input signal $D_3$ of a sense circuit is switched to the H level 0.7 ns later, i.e. at 1.7 ns in compliance with the input signal $D_2$ of the driver at the H level. The input signal $D_3$ is an output signal of the memory cell array 4 also in this case but not always at the H level as mentioned above.

When the clock signal CLK is switched to the H level at 2.0 ns likewise, an input signal $D_4$ of an output circuit is switched 0.4 ns later, i.e. at 2.4 ns in compliance with the input signal $D_3$ of the sense circuit at the H level. When the clock signal CLK is switched to the H level at 3.0 ns, an output signal DO of the output circuit is switched to the H level at 0.5 ns, i.e. at 3.5 ns in compliance with the input signal $D_4$ of the output circuit at the H level.

In the aforementioned operations, attention should be directed to the fact that the read cycle time of this memory can be made 1.0 ns despite the access time thereof (the delay time from the input signal of the address buffer up to the output signal) being $0.4+0.7+0.4+0.5=2.0$ ns.

In the aforementioned memory, however, the problem is that the output signal may be produced in a cycle different from the cycle in which it should be produced in case the phase of the clock signal CLK shifts or the delay time of the signal within the circuit block varies.

This problem will subsequently be explained with reference to FIG. 3.

In order to clarify the point at issue, FIG. 3 shows an example of the input signal $D_1$ of the address buffer that has been switched only once.

In FIG. 3, desired waveforms of this memory are indicated by continuous lines. As mentioned above, there is shown a case where the output signal DO of the output circuit is switched to the H level at 3.5 ns simultaneously with the switching of the clock signal CLK to the H level at 3.0 ns.

On the other hand, broken lines in FIG. 3 represent signal waveforms at their respective nodes as an example of trouble wherein the delay time of the signal in the circuit block varies to the extent that the delay time from the address buffer 1 up to the driver 3 has decreased to 0.2 ns.

What has posed a problem in that case is that the clock signal CLK has been switched to the L level at 0.3 ns after the input signal $D_2$, of the driver is switched to the H level at 0.2 ns in conformity with the clock signal CLK switched to the H level at 0.0 ns, all the latch circuits put to the through-state and the input signal $D_1$ of the address buffer at the H level. Even when the input signal $D_2$ of the driver is switched to the H level at 0.2 ns, all the latch circuits remain in the through-state and therefore the input signal $D_3$ of the sense circuit is switched to the H level 0.7 ns later, i.e. at 0.9 ns in compliance with the input signal $D_2$ of the driver. As a result, the input signal $D_4$ of the output circuit is switched to the H level 0.4 ns later, i.e. at 1.4 ns in compliance with the input signal $D_3$ of the sense circuit at the H level when the clock signal CLK is subsequently switched to the H level at 1.0 ns. When the clock signal CLK is switched to the H level at 2.0 ns, the output signal DO of the output circuit is switched to the H level 0.5 ns later, i.e. at 2.5 ns in compliance with the input signal $D_4$ of the output circuit at the H level. In other words, the output signal DO of the output circuit is produced in a cycle (after CLK is switched to the H level at 2.0 ns) different from the cycle (after CLK is switched to the H level at 3.0 ns) in which it should be produced.

Since the memory system incorporating this memory is designed to cause the output signal DO of the memory to be produced in the cycle after the clock signal CLK is switched to the H level at 3.0 ns, it will instantly malfunction if such a phenomenon appears.

Although a description has been given of the problems resulting from the variations of the delay time of the signal in the circuit block, similar problems will be brought about when the phase of the clock signal CLK shifts; e.g. when the clock signal CLK is switched to the L level not at 0.3 ns but at 0.5 ns.

Various methods may be considered to obviate such problems. However, each of them may also induce another problem.

A first method considered effective in obviating the problems is to quicken the timing at which the clock signal CLK is switched to the L level, i.e. to shorten the duration of the H level, to prevent malfunction even if the input signal $D_2$ of the driver is switched to the H level earlier as the delay time from the address buffer up to the driver decreases. However, the duration of the H level of the clock signal CLK cannot to made shorter than the time required to obtain data. In other words, the latch circuit will be caused to malfunction if the duration of the H level of the clock signal CLK is set too short.

A second method for the purpose is to delay the switching of the input signal $D_2$ of the driver to the H level by inserting a delay circuit between the address buffer and the driver. Notwithstanding, this method requires an additional circuit like the delay circuit and allows the switching of the input signal $D_2$ of the driver to vary on the lagging side. When the input signal $D_2$ of the driver is switched to the H level after the clock signal CLK is switched to the L level (at 1.3 ns or later), the memory system may malfunction as well.

In a semiconductor device having more than two circuit blocks connected in series according to the present invention, each circuit block includes latch means and the latch means in two of the circuit blocks adjacent to each other are arranged so that they are prevented from being placed at a through-state simultaneously.

The semiconductor device according to the present invention has circuits including latch circuits of a plurality of stages, wherein the latch circuits of at least two stages are connected in such a manner that the output signal of the latch circuit at the preceding stage is fed to the latch circuit at the following stage directly or indirectly via any other circuit and wherein the latch circuits at the preceding and the following stages are in inverse phase with each other.

The aforementioned problems are encountered since the latch circuits of two stages connected in such a manner that the output signal of the latch circuit at the preceding stage is fed to the latch circuit at the following stage directly or via any other circuit can be put to the through-state simultaneously. In the case of the aforementioned example of FIG. 3, for instance, the clock signal CLK is switched to the H level at 0.0 ns and the latch circuit of the address buffer 1 is put to the through state and, when the input signal $D_2$, of the driver is switched to the H level at 0.2 ns, the latch circuit of the driver 3 is also put to the through-state. Consequently, the input signal $D_3$ of the sense circuit is also switched to the H level at 0.9 ns in compliance with the input signal $D_2$ of the driver.

In the latch circuits of two stages connected in such a manner that the output signal of the latch circuit at the preceding stage is fed to the latch circuit at the following stage directly or indirectly via any other circuit, the latch circuits at the preceding and following stages are operated in inverse phase, whereby the latch circuits of two stages are not allowed to be in the through-state simultaneously. The aforementioned problems can thus be solved theoretically.

In order to operate the latch circuits at the preceding and following stages in inverse phase, latch circuits at the preceding and following stages should be supplied with clock signals in inverse phase or otherwise one of the latch circuits should be put to the through-state, whereas the other should be put to the hold-state when clock signals in phase are fed to them.

Another concept of the present invention is to employ a master-slave latch circuit in part of the memory circuit arrangement or to provide at least two or more latch circuits in the memory circuit arrangement, which are to be driven by means of a two-phase or multiphase clock signal.

The advantage of this means is that the speed of the memory can readily be increased.

In a digital device having a memory LSI including a plurality of latch circuits within a memory chip, the latch circuit of the above-described memory circuit is driven by a clock signal having a frequency which is integrally proportional to the frequency of the main clock signal for the digital device.

The advantage of this means is that the speed of the memory of the digital device can be made higher than that of this system operated by the main clock signal.

The master-slave latch circuit is defined by a latch circuit having a master circuit and a slave circuit therein and these two latch circuits are driven by means of, e.g. clock signals in inverse phase, whereby input data is taken into the master circuit and then transferred to the slave circuit before being sent out.

This circuit can be operated synchronously by a clock independently of the clock frequency below that of the highest frequency of operation.

The aforementioned means makes pipelined operation possible with stability even though the clock frequency is changed drastically.

Instead of converting the latch circuits within the memory LSI to master-slave circuits, these latch circuits therein may be driven by a multiphase clock signal whose phases are free from overlapping.

Even if the clock cycle of the aforementioned means is changed drastically, stable pipelined memory operation is still possible.

In the case of the latch circuits in this means, such a two-stage master-slave arrangement is unnecessary and relatively short a delay time makes it easier to increase the speed of the memory circuit.

In a device (e.g. a computer) using a pipelined memory having a number of latch circuits, the latch circuit of the above-described memory circuit driven by a clock signal having a frequency integrally proportional to the frequency of the main clock signal for the digital device also makes it possible to render the speed of the memory operation of the device higher than that of the main clock operation.

According to the present invention, no special latch circuits are added while circuits that have been used as peripheral circuits of the memory are utilized as latch circuits with only a few parts such as transistors added thereto. As a result, an increase in chip area is minimized, whereas delay time is prevented from increasing since the circuits originally fitted are used as latch circuits.

An object of the present invention is to provide a memory capable of high-speed operation.

Another object of the present invention is to provide a memory almost free from malfunctioning.

Still another object of the present invention is to provide a pipelined memory fit for its drive cycle to be increased in speed, wherein the problem of malfunctioning resulting from the phase shifting of the aforementioned clock signal CLK or variations of delay time of a signal in a circuit block has been solved theoretically.

Still another object of the present invention is to provide a pipelined memory having a plurality of latch circuits within a chip and capable of not only high-speed cycle operation but also stable memory operation according to an extremely slow or fast clock signal, i.e. even if the clock frequency is changed drastically.

A further object of the present invention is to provide a digital device capable of stable, high-speed operation using such a memory.

These and other objects and many of the attendant advantages of this invention will be readily appreciated as the same becomes better understood by reference to the following detailed description when considered in connection with the accompanying drawings.

DETAILED DESCRIPTION OF THE INVENTION

Figure 4:
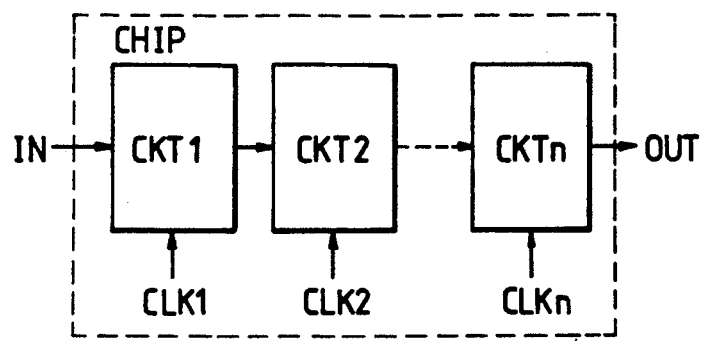
FIG. 4 is a block diagram illustrating the overall concept of the present invention.

FIG. 4 is a diagram illustrating the general concept of the present invention. In FIG. 4, there is shown a semiconductor integrated circuit having n (n≧3) pieces of circuit blocks (CKT1–CKTn) including latch means in a signal path from IN to OUT. Clock signals (CLK1–CLKn) for controlling the hold- and through-states of latch circuits are fed to their respective circuit blocks. Each circuit block operates synchronously with the clock signal. The present invention selects one of the cases where (1) a first clock signal CLK1 and a second clock signal CLK2 are in inverse phase; (2) the latch circuits are arranged so that, when CLK1 and CLK2 are in the same phase, the latch circuit in CKT2 is placed in the through-state while the latch circuit in CKT1 remains in the hold-state; (3) the latch circuits in CKT1 and CKT2 are made master-slave type latch circuits; (4) and CLK1 and CLK2 are in inverse phase. Even though the delay time of the signal in each circuit block varies, for instance, malfunction can be prevented in this way because the circuit blocks will not operate in the same phase as before. The nth clock signal CLKn becomes equal to the first clock signal CLK1 when n is an odd number (3, 5, 7 . . . ), whereas it becomes equal to the second clock signal CLK2 when n is an even number (4, 6, 8 . . . ).

Figure 5:
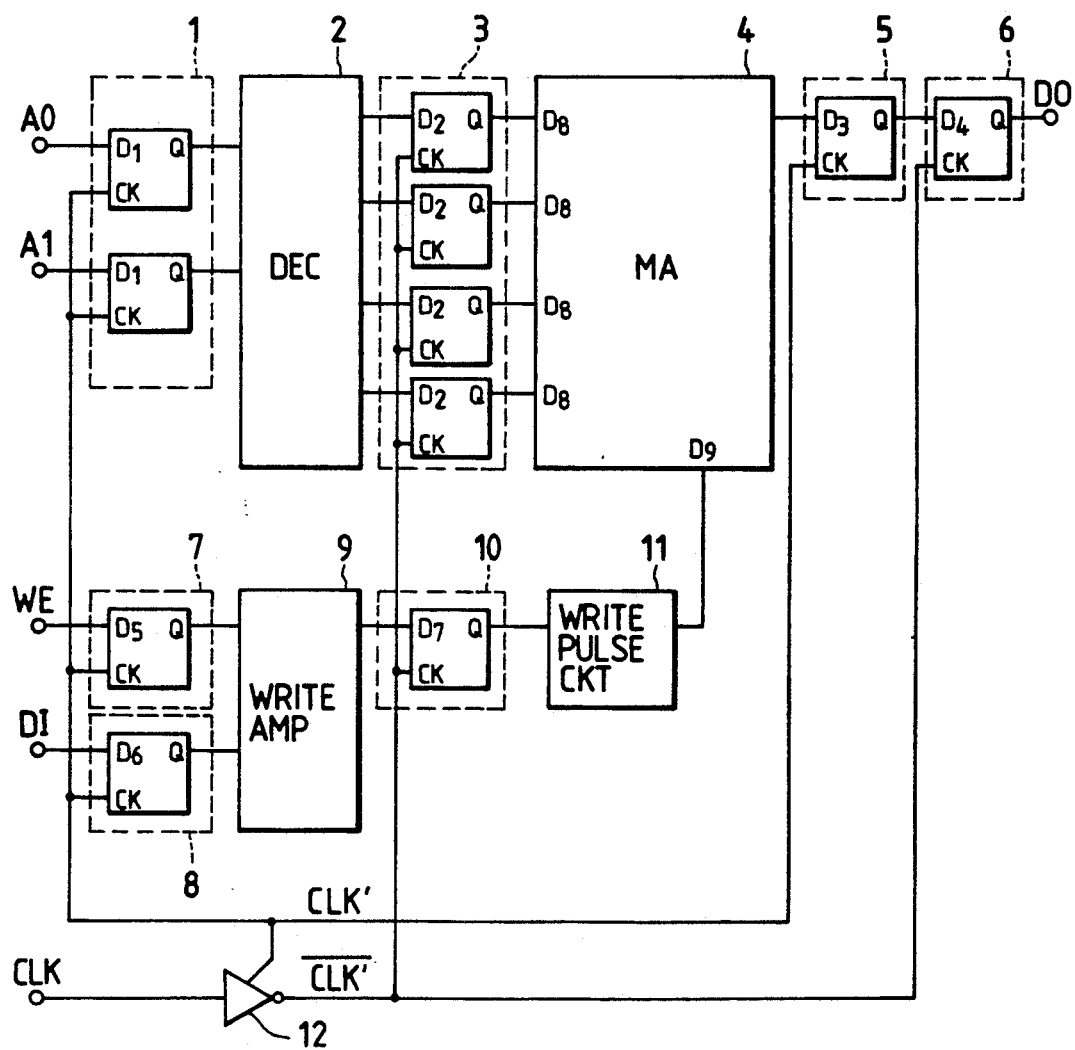
FIG. 5 is a block diagram of a pipelined memory as a first embodiment of the present invention.

FIG. 5 is a block diagram of a first embodiment of the present invention.

In this embodiment, four-stage latch circuits (i.e., four stages of latch circuits) are provided within a signal path from address input terminals A0, A1 up to a data output terminal D0, whereas two-stage latch circuits (i.e., two stages of latch circuits) are provided within a signal path from a write control signal input terminal WE and a data input terminal DI up to a memory cell of the array 4. A memory is thus constructed.

In FIG. 5, A0, A1 designate address input terminals, WE a write control signal input terminal; DI a data input terminal; D0 a data output terminal; and CLK a clock signal. Moreover, the latch circuits are shown by D-type flip flops, wherein Di (i=1–7) designates a data input terminal of each latch circuit; Q each data output terminal; and CK each clock signal input terminal for controlling the through- and hold-states at each of the latch circuits.

Figure 1:
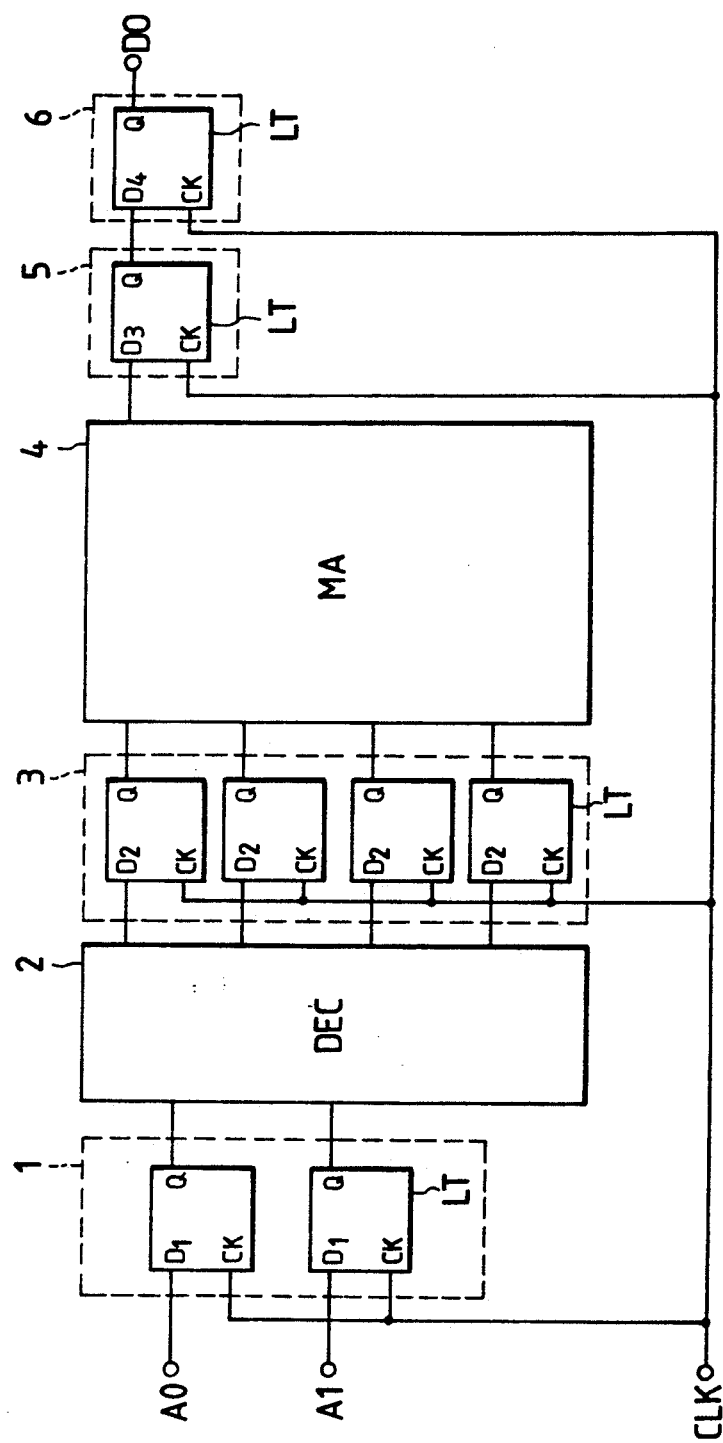
FIG. 1 is a block diagram of a pipelined memory embodying the present invention and illustrating problems discovered by the present inventors.

The difference between the embodiment of FIG. 5 and the circuit of FIG. 1 lies in the fact that the latch circuits in an address buffer 1 and a driver 3, the driver 3 and a sense circuit 5, and the sense circuit 5 and an output circuit 6 are mutually driven in inverse phase by passing a clock signal CLK through an inverter 12 to form clock signals CLK' and CLK' in inverse phase with each other, driving the address buffer 1 and the sense circuit 5 according to the clock signal CLK', and driving the driver 3 and the output circuit 6 according to the clock signal CLK'.

With this arrangement, the aforementioned malfunction is prevented. The reason for this will subsequently be described.

Figure 6:
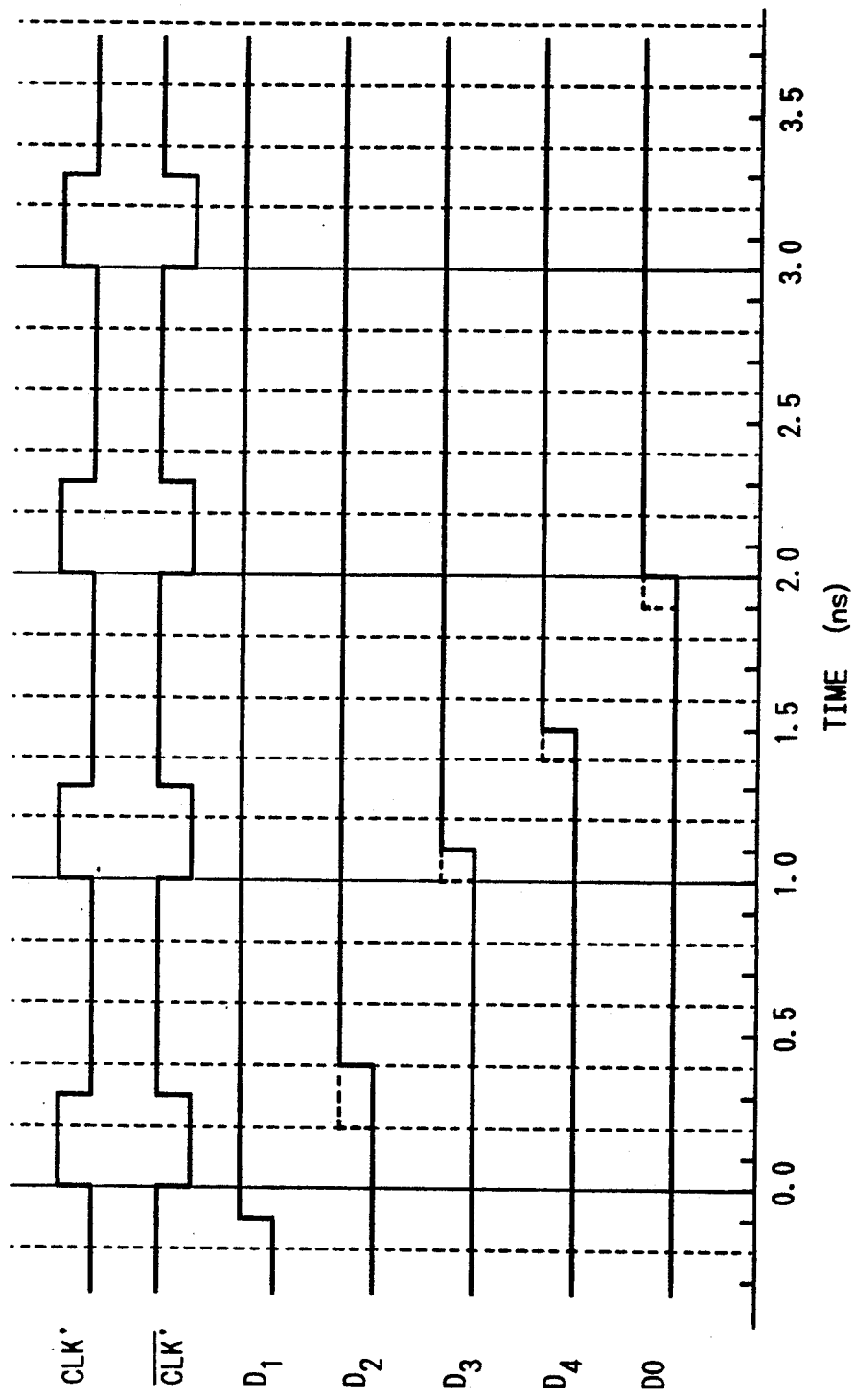
FIG. 6 is a waveform chart illustrating signal waveforms at their respective nodes of FIG. 5.

FIG. 6 is a waveform chart illustrating signal waveforms at their respective nodes of FIG. 5. In FIG. 6, like FIGS. 2 and 3, the cycle of the clock signal CLK' and the duration of a H level are set at 1.0 ns and 0.3 ns, respectively. The cycle of the clock signal CLK' in inverse phase and the duration of an L level accordingly become 1.0 ns and 0.3 ns, respectively. Moreover, the delay time of the signal in the circuit block also becomes equal to the value shown in FIGS. 2 and 3, i.e. the delay time from the address buffer 1 up to the driver 3 is assumed 0.4 ns; the delay time from the driver 3 up to the sense circuit 5, 0.7 ns; the delay time from the sense circuit 5 up to the output circuit 6, 0.4 ns; and the delay time within the output circuit 6, 0.5 ns.

In FIG. 6, the clock signal CLK' is switched to the H level at 0.0 ns first as shown by a continuous line and, when the latch circuits in the address buffer 1 and the sense circuit 5 are put to the through-state, the input signal $D_2$ of the driver is switched to the H level 0.4 ns later, i.e. at 0.4 ns in compliance with the input signal $D_1$ of the address buffer at the H level.

At 0.3 ns, the clock signal CLK' is switched to the L level and the latch circuits in the address buffer 1 and the sense circuit 5 are put to the hold-state. However, the address buffer 1, for instance, keeps outputting the H level in compliance with the input signal $D_1$ of the address buffer at the H level and therefore exerts no influence upon the input signal $D_2$ of the driver. Since the clock signal $\overline{CLK'}$, is switched to the H level at 0.3 ns, the latch circuits in the driver 3 and the output circuit 6 are put to the through-state.

When the input signal $D_2$, of the driver is switched to the H level at 0.4 ns, the input signal $D_3$ of the sense circuit is switched to the H level 0.7 ns later, i.e. at 1.1 ns as the latch circuit of the driver 3 has been put to the through-state.

When the input signal $D_3$ of the sense circuit is switched to the H level at 1.1 ns likewise, the input signal $D_4$ of the output circuit is switched to the H level 0.4 ns later, i.e. at 1.5 ns as the latch circuit of the sense circuit 5 has been put to the through-state at 1.0 ns. At this time, moreover, the output signal DO of the output circuit is switched to the H level at 2.0 ns since the latch circuit of the output circuit 6 has been put to the through-state at 1.3 ns.

Attention should be directed to the fact that the read cycle time of this memory can be made 1.0 ns despite the access time thereof (the delay time from the input signal of the address buffer up to the output signal) being $0.4+0.7+0.4+0.5=2.0$ ns. In this embodiment, moreover, the output signal can never be produced in a cycle different from the cycle in which it should be produced in case the phase of the clock signal CLK' shifts or the delay time of the signal within the circuit block varies.

Referring to FIG. 6, a description will subsequently be given of the reason why the aforementioned problem is not posed.

Based on the assumption that the delay time of the signal in the circuit block varies and that the delay time from the address buffer 1 up to the driver 3 becomes smaller than 0.2 ns, FIG. 6 shows a waveform chart illustrating signal waveforms at their respective nodes.

Figure 3:
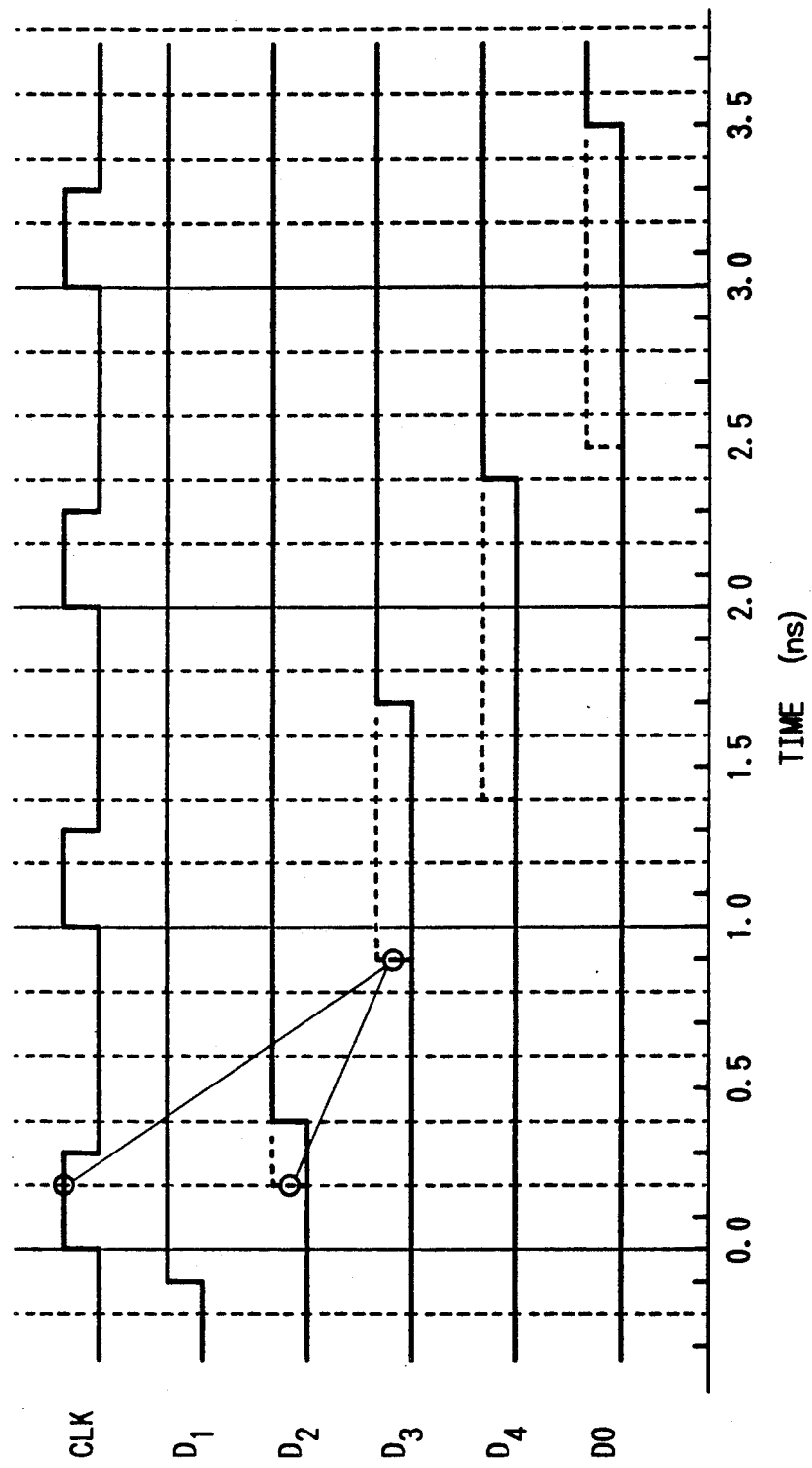
FIG. 3 is another waveform chart illustrating signal waveforms at their respective nodes of FIG. 1.

In the case of the example shown in FIG. 3, the input signal $D_3$ of the sense circuit is switched in compliance with the input signal $D_2$ of the driver since all the latch circuits are in the through-state when the input signal $D_2$ of the driver is switched to the H level at 0.2 ns. This state results in malfunction. In this embodiment, however, the latch circuit of the driver 3 is not yet in the through-state when the input signal $D_2$ of the driver is switched to the H level at 0.2 ns and consequently the input signal $D_3$ of the sense circuit is prevented from being switched in compliance with the input signal $D_2$ of the driver. In other words, the input signal $D_3$ of the sense circuit is switched to the H level 0.7 ns later, i.e. at 1.0 ns only when the clock signal CLK' is switched to the L level at 0.3 ns and when the latch circuit of the driver 3 is put to the through-state.

In the same way, the input signal $D_3$ of the sense circuit is switched to the H level at 1.0 ns and the input signal $D_4$ of the output circuit is switched to the H level 0.4 ns later, i.e. at 1.4 ns as the latch circuit of the sense circuit 5 is put to the through-state. At this time, the output signal DO of the output circuit is switched to the H level 0.5 ns later, i.e. at 1.9 ns since the latch circuit of the output circuit 6 is put to the through-state at 1.3 ns.

As set forth above, this embodiment is different from what has been described in FIG. 3 and, even though the delay time from the address buffer 1 up to the driver 3 decreases to 0.2 ns, the output signal DO of the output circuit is produced in the cycle (after CLK' is switched to the L level at 1.3 ns) in which it should be produced.

Although the above example refers to a case where the delay time of the signal in the circuit block varies, the same argument is justifiable even when the phase of the clock signal CLK' shifts, i.e. when the CLK' is switched to the L level not at 0.3 ns but 0.5 ns. Therefore, no malfunction occurs.

In this embodiment, further, a circuit (inverter 12) is only necessary as an additional circuit for producing the clock signal CLK' in inverse phase and it is unnecessary to precisely control the clock signal in particular.

Figure 2:
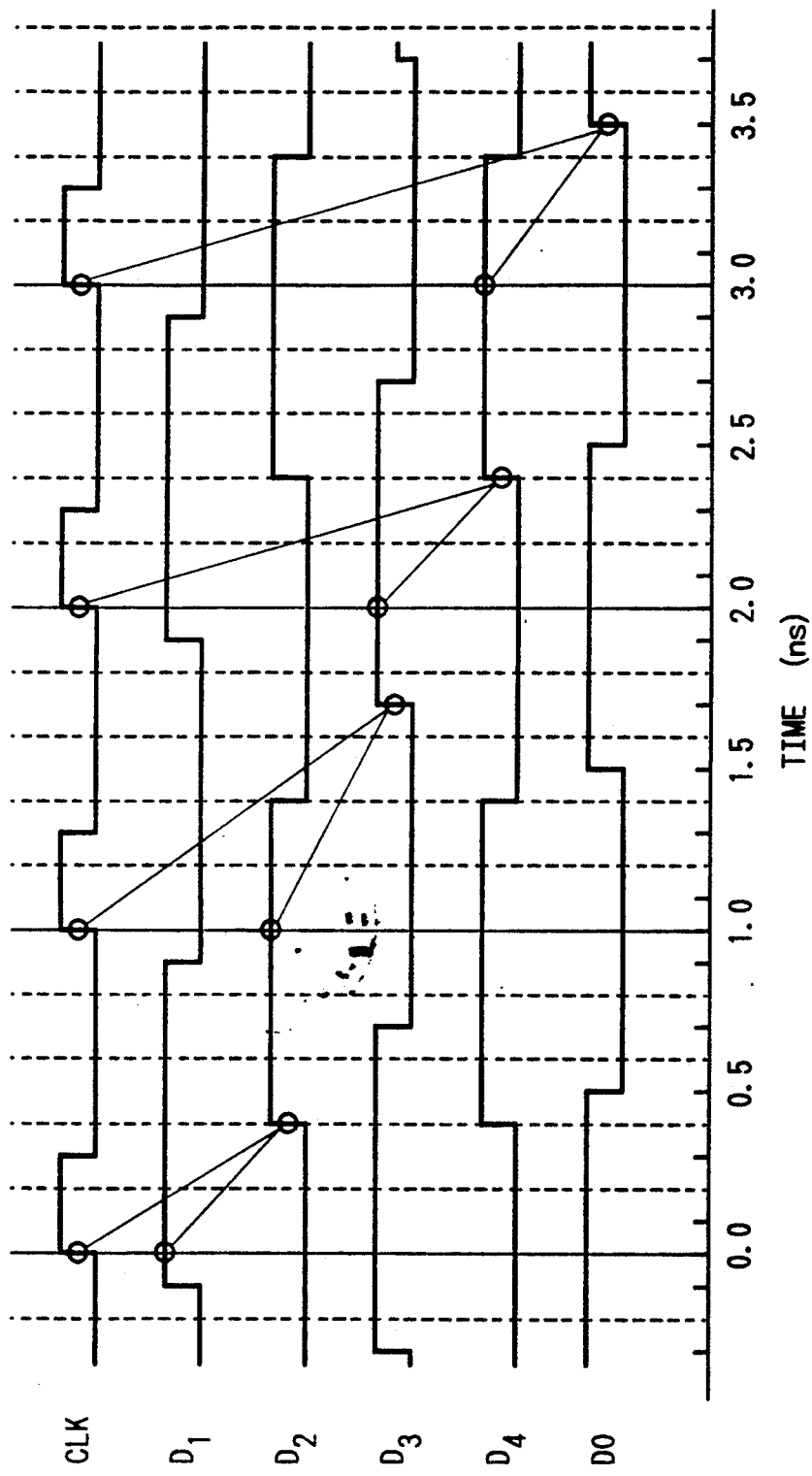
FIG. 2 is a waveform chart illustrating signal waveforms at their respective nodes of FIG. 1.

Another important point in this embodiment is that, unlike the output signal DO of the output circuit which is produced in the cycle after the clock signal CLK is switched 3.0 ns later (at 3.5 ns) as shown in FIG. 2, it is produced in the cycle after the clock signal CLK' is switched 1.3 ns later (at 2.0 ns) as shown in FIG. 6. In other words, the output signal DO is produced 1.5 ns earlier $(3.5-2.0=1.5)$ in the case of FIG. 6. This means that the time required for the output signal DO to be sent out after the input signal $D_1$ is fed to the address buffer, i.e. the travel time of the signal from the address input terminal up to the data output terminal, can be shortened. Provided the travel time of the signal is shortened, the speed of the memory system incorporating this memory can needless to say be increased to that extent.

The write circuit shown in FIG. 5 will be described. The write circuit features, in the first place, two-stage latch circuits within the signal path from the write control signal input terminal WE and the data input terminal DI to the memory cell of the array 4. With this arrangement, it is possible to make the write cycle time shorter than the sum of the delay time of the signal from the write control signal input terminal WE or data input terminal DI up to the memory cell of the array 4 and the switching time of the memory cell.

The reason for this will be described with reference to FIG. 7.

Figure 7:
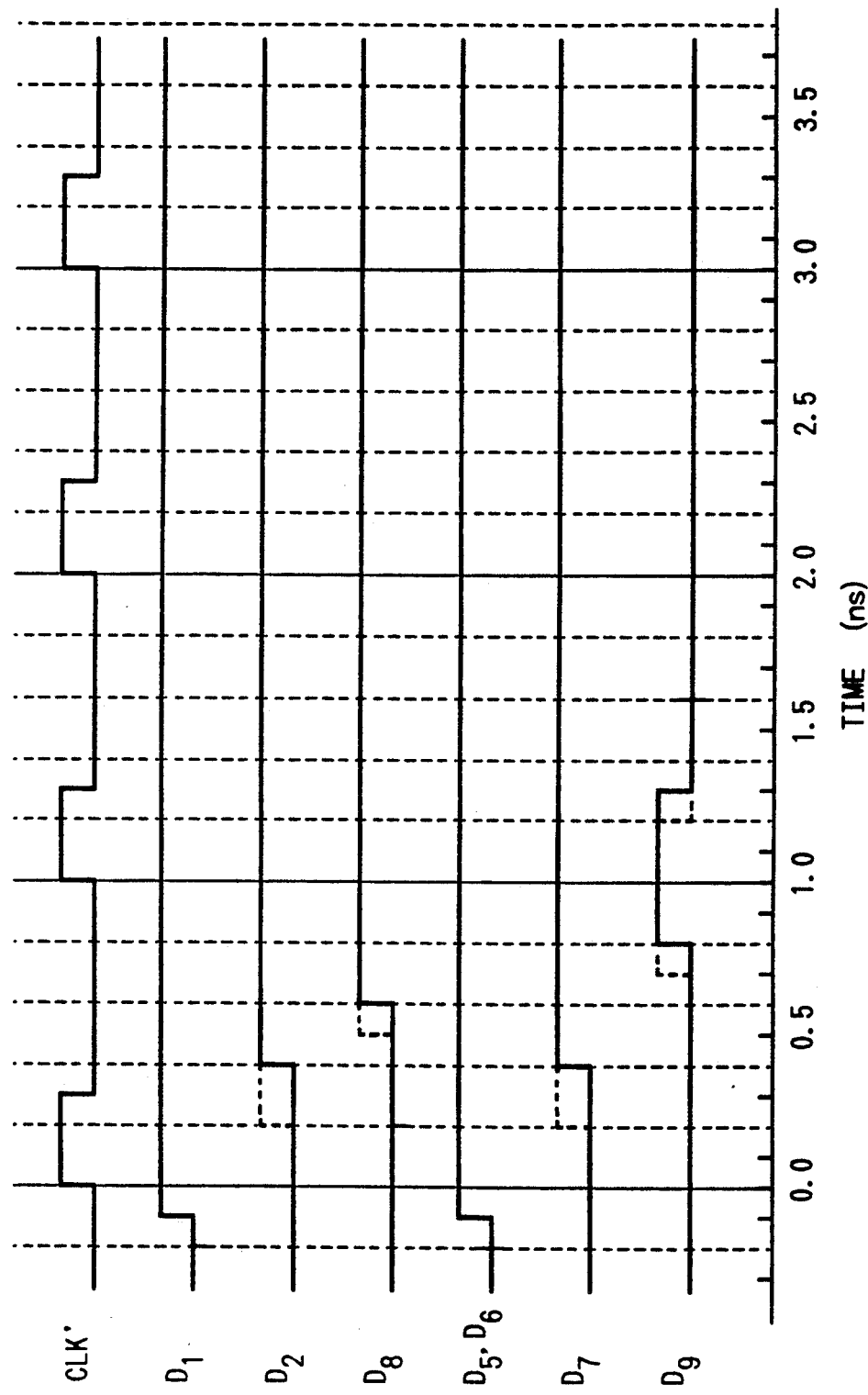
FIG. 7 is a waveform chart illustrating signal waveforms at their respective nodes in the write circuit of FIG. 5.

FIG. 7 is a waveform chart illustrating signal waveforms at their respective nodes in the write circuit in addition to waveforms shown in FIG. 6.

The waveforms of FIG. 7 assume the delay time from a WE buffer 7 or DI buffer 8 up to a latch circuit 10 at the preceding stage of a write pulse generator 11 to be 0.4 ns, the switching time of the memory cell to be 0.5 ns and the write pulse generator 11 to be what produces a pulse signal 0.5 ns in width after securing setup time of 0.4 ns in compliance with a signal $D_7$ fed to the latch circuit 10 at the preceding stage thereof.

As shown by a continuous line of FIG. 7, the input signal $D_7$ of the latch circuit 10 is switched to the H level 0.4 ns later, i.e. at 0.4 ns in compliance with the input signal $D_5$ of the WE buffer 7 and the input signal $D_6$ of the DI buffer 8 at the H level when the clock signal CLK' is switched to the H level at 0.0 ns and simultaneously when the latch circuits of the WE buffer 7 and DI buffer 8 are put to the through-state. Since the latch circuit at the preceding stage has been put to the through-state at 0.3 ns, the write pulse generator 11 takes the setup time of 0.4 ns and generates a pulse signal $D_9$, 0.5 ns wide from 0.8 ns. In other words, the write cycle time can be set at 1.0 ns despite the fact that the sum of the delay time of the signal from the write control signal input terminal WE or data input terminal DI up to the memory cell 4 and the switching time of the memory cell is $0.4+0.4+0.5=1.3$ ns.

The write circuit features, in the second place, the use of the clock signals CLK' and $\overline{CLK'}$ in inverse phase for driving the latch circuits in the WE buffer 7 and the DI buffer 8 and the latch circuit 10 at the preceding stage of the write pulse generator 11, respectively. With this arrangement, the output signal can never be produced in a cycle different from the cycle in which it should be produced in case the phase of the clock signal CLK' shifts or the delay time of the signal within the write circuit varies. This is because the argument made in FIG. 6 is justifiable as shown by a broken line of FIG. 7.

The write circuit features, in the third place, the setting of the number of stages of latch circuits provided in the signal path from the write control signal input terminal WE or data input terminal DI up to the memory cell of the array 4 is equal to that of latch circuits provided in the signal path from the address input terminals A0, A1 up to the memory cell of the array 4 (equally two stages).

With this arrangement, a cell selection signal $D_8$ and the write pulse signal $D_9$ are switched in the same cycle as the cycle after the clock signal CLK' is switched to the L level at 0.3 ns in compliance with the input signal $D_1$ of the address buffer and the input signal $D_5$ of the WE buffer that are switched to the H level in the cycle in which the clock signal CLK' is switched to the H level at 0.0 ns as shown in FIG. 7. When some data is written to a certain address, it is only necessary to feed an address input signal, a write control signal and input data to the address input terminal, the write control signal input terminal and the data input terminal in the same cycle without worrying about the operation inside the memory.

Figure 8:
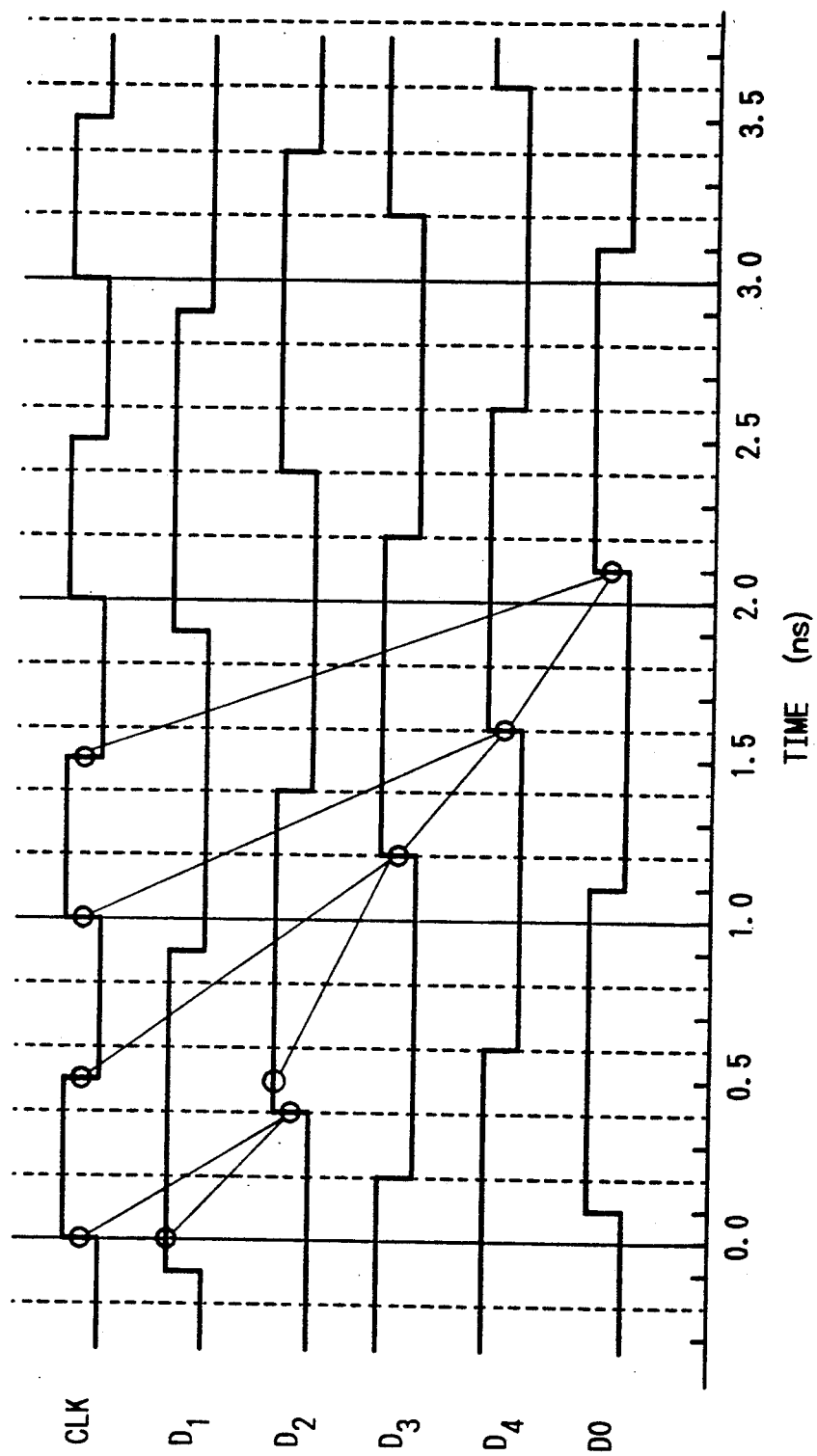
FIG. 8 is a signal waveform chart illustrating a second embodiment of the present invention with another example of a clock signal to be fed to the memory of FIG. 5.

FIG. 8 is a signal waveform chart illustrating a second embodiment of the present invention, wherein the clock signal CLK' and the clock signal CLK' in inverse phase illustrate an example different from those shown in FIG. 6 and 7.

In the case of the example shown in FIG. 6 or 7, the cycle of the clock CLK' and the H level have been set at 1.0 ns and 0.3 ns, respectively. In FIG. 8, however, the cycle of the clock CLK' and the duration of the H level are set at 1.0 ns and 0.5 ns, so that the duration of the H level and that of L level are equalized. Even with this arrangement, the memory is apparently caused to operate normally as shown in FIG. 8.

The reason for the adoption of such a clock signal is attributed to the fact that most of the clock signals used in the memory system are those which normally have the equal duration of the H and L levels. The clock signal as it is of the memory system can therefore be fed to the clock signal input terminal of the memory. The advantage in this case is that no clock signals having different duration of the H and L levels are necessary to generate in particular.

Figure 9:
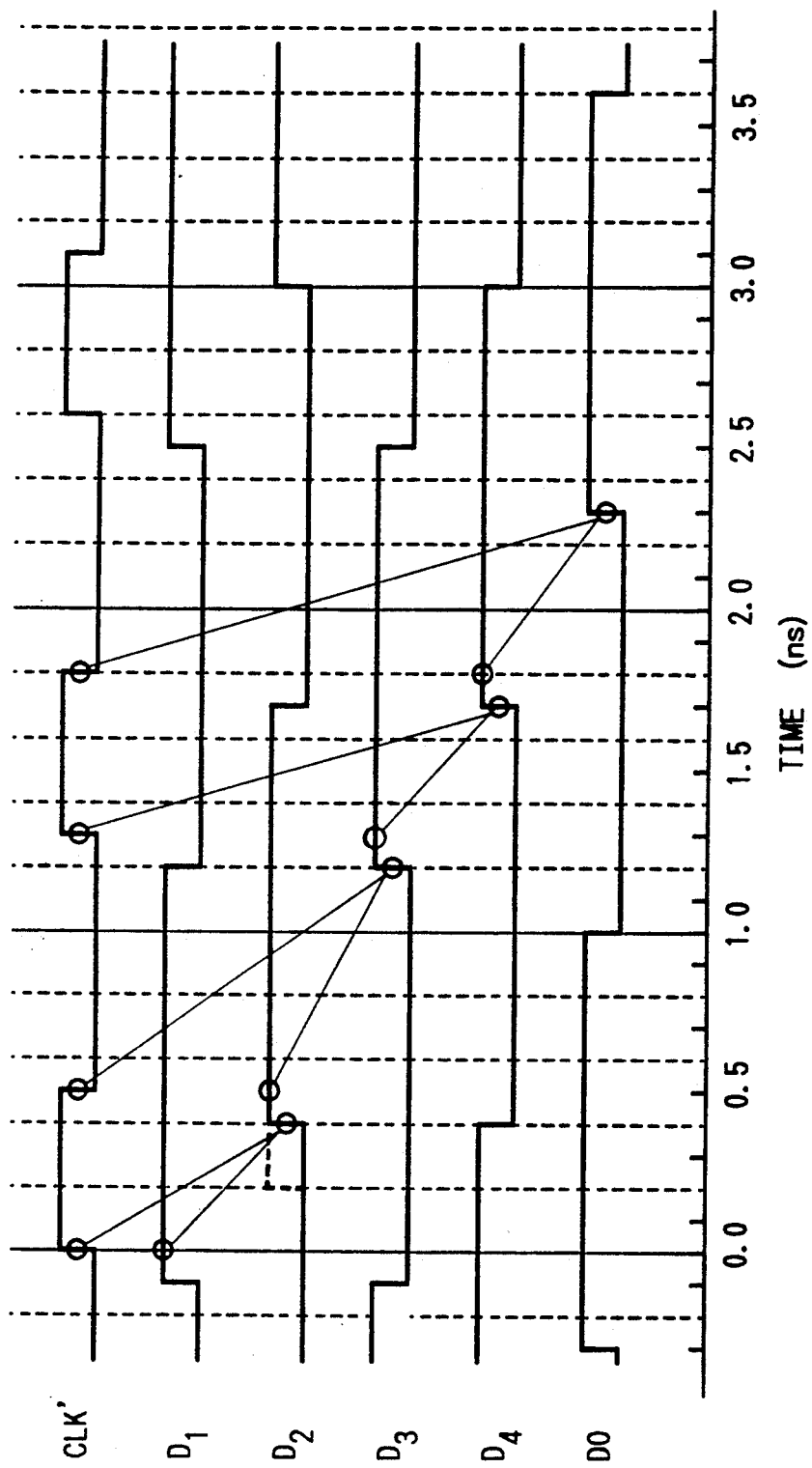
FIG. 9 is a signal waveform chart illustrating a third embodiment of the present invention with still another example of a clock signal to be fed to the memory of FIG. 5.

FIG. 9 is a signal waveform chart illustrating a third embodiment of the present invention, wherein the clock signal CLK' and the clock signal $\overline{CLK'}$ in inverse phase illustrate an example different from those shown in FIG. 6 and 7.

In the case of the example shown in FIG. 6 or 7, the cycle of the clock CLK' and the H level have been set at 1.0 ns and 0.3 ns, respectively. In FIG. 9, however, the cycle of the clock CLK' and the duration of the H level are set at 1.3 ns and 0.5 ns, whereas the duration of the Level is set at 0.8 ns. Even with this arrangement, the memory is apparently caused to operate normally as shown in FIG. 9.

The reason for the adoption of such a clock signal is attributed to the fact that the switching timing of each signal is generally determined by the switching timing of the clock signal if the duration of the H level of the clock signal is made substantially equal to or greater than the delay time until the signal produced from the latch circuit for putting the clock signal at the H level to the through-state reaches the next latch circuit or if the duration of the L level of the clock signal is made substantially equal to or greater than the delay time until the signal produced from the latch circuit for putting the clock signal at the L level to the through-state reaches the next latch circuit.

In the circuit of FIG. 5, the latch circuits in the address buffer 1 and the sense circuit 5 are put to the through-state when the clock signal is at the H level. The duration of the H level of the clock signal in this embodiment is therefore set at 0.5 ns in order that it may be fit for the conditions above in consideration of the delay time 0.4 ns from the address buffer 1 up to the driver 3 and the delay time 0.4 ns from the sense circuit 5 up to the output circuit 6.

In the circuit of FIG. 5, the latch circuits in the driver 3 and the output circuit 6 are put to the through-state when the clock signal is at the L level. The duration of the L level of the clock signal in this embodiment is therefore set at 0.8 ns in order that it may be fit for the conditions above in consideration of the delay time 0.7 ns from the driver 3 up to the sense circuit 5 and the delay time 0.5 ns in the output circuit 6.

As a result, the timing at which each signal is switched is generally determined by the switching timing of the clock signal as shown in FIG. 9. The following effect is therefore obtained. Although the output signal DO of the output circuit is being produced in the cycle in which it should be produced as shown by the broken line of FIG. 6 when the delay time from the address buffer 1 up to the driver 3 decreases to 0.2 ns, its switching timing has shifted from 2.0 ns to 1.9 ns, whereas in the case of FIG. 9, the switching timing of the output signal DO of the output circuit remains at 2.3 ns as shown by the broken line even when the delay time decreases to 0.2 ns. In other words, the switching timing of the output signal is kept always constant even though the delay time of the signal in the circuit block varies. This is very convenient for the memory system incorporating this memory.

Figure 10:
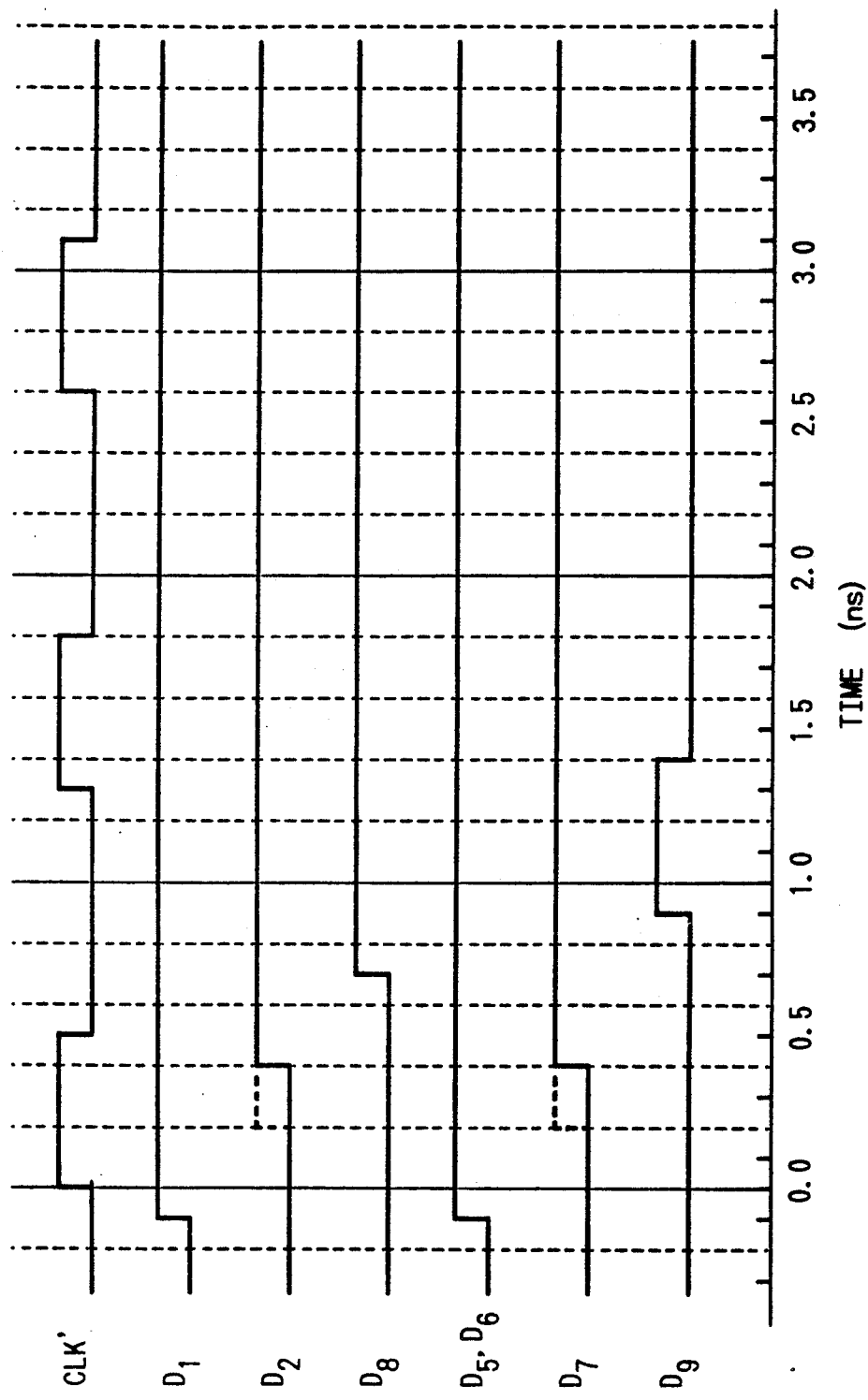
FIG. 10 is a signal waveform chart illustrating another effect of the third embodiment thereof.

FIG. 10 is a signal waveform chart illustrating another effect of the third embodiment thereof in the form of a signal waveform in the write circuit at the time the clock signal is set in the manner described above.

The switching timing of each signal is generally determined by the switching timing of the clock signal also in this case. The switching timing of the write pulse signal $D_9$ has shifted from 0.8 ns to 0.7 ns as shown by the broken line of FIG. 7 when the delay time from the WE buffer 7 and the DI buffer 8 up to the latch circuit 10 at the preceding stage of the pulse generator 11 decreases to 0.2 ns. On the contrary, the switching timing of the write pulse signal $D_9$ remains unchanged from 0.9 ns even when the delay time decreases as shown by the broken line of FIG. 10. Moreover, the switching timing of the cell selection signal $D_8$ remains unchanged from 0.7 ns even when the delay time from the address buffer 1 up to the driver 3 decreases. In other words, the switching timing of the cell selection signal $D_8$ and the write pulse signal $D_9$ is always kept constant even when the delay time of the signal in the circuit block varies. The setup time of the write pulse signal $D_9$ relative to the cell selection signal that had to be increased to the extent the delay time of the signal in the circuit block can be decreased and the cycle speed can therefore be increased to that extent.

Figure 11:
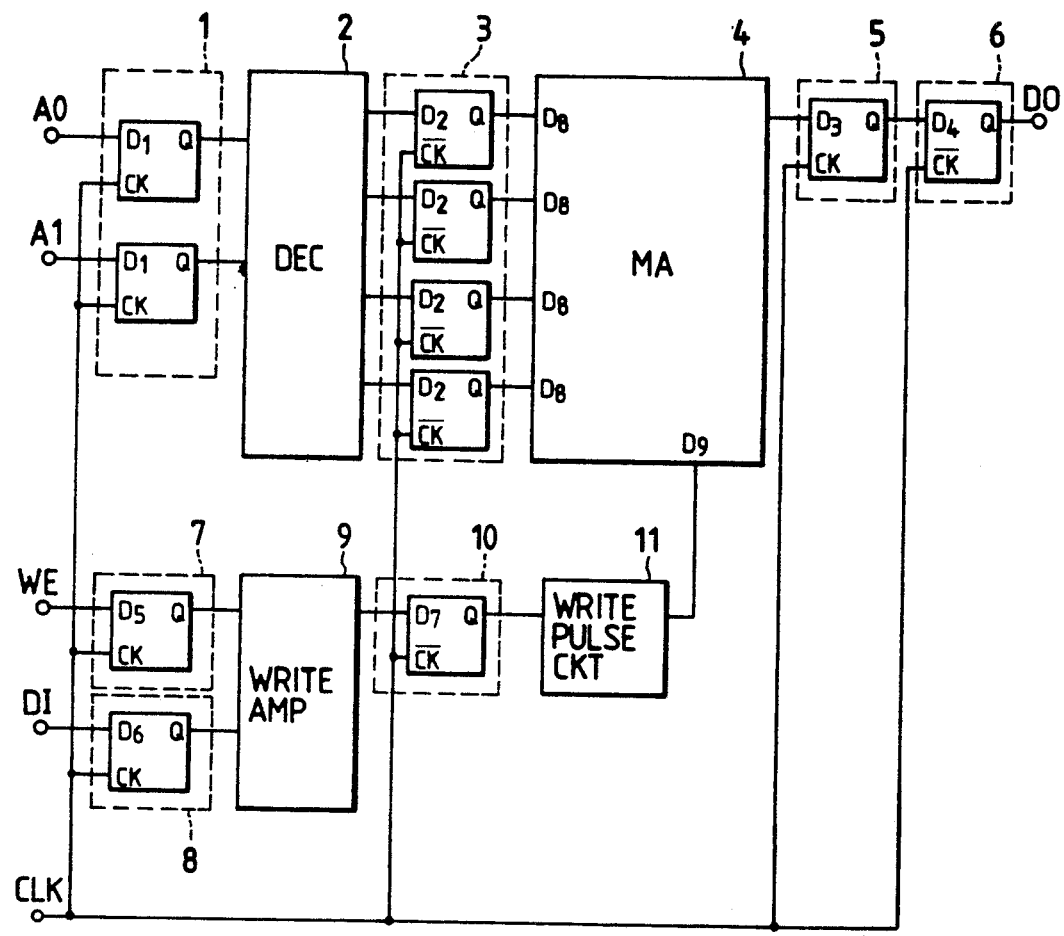
FIG. 11 is a block diagram of a pipelined memory as a 4th embodiment of the present invention.

FIG. 11 is a block diagram of a 4th embodiment of the present invention.

The difference between FIG. 11 and FIG. 5 lies in the face that, unlike the circuit of FIG. 5 wherein the latch circuits in address buffer 1 and the driver 3, the driver 3 and the sense circuit 5, the sense circuit 5 and the output circuit 6, the WE buffer 7 and the DI buffer 8, and the latch circuit 10 at the preceding stage of the write pulse generator 11 are driven by the clock signals CLK', $\overline{CLK}'$ in inverse phase, all of these circuits are driven by clock signal in the same phase in FIG. 11, whereas latch circuits employed instead operate in inverse phase in that one latch circuit is put to the through-state (or hold-state) when the clock signal is at the H level and the other is put to the through-state (or hold-state) when the clock signal is at the L level.

More specifically, the latch circuits in the address buffer 1, the sense circuit 5, the WE buffer 7 and the DI buffer 8 out of those shown by D-type flip flops in FIG. 11 are put to the through-state when the clock signal CLK is at the H level and each lock signal input terminal is given a symbol CK. On the other hand, the latch circuits in the driver 3, the output circuit 6 and the latch circuit 10, at the preceding stage of the write pulse generator 11, are latch circuits that are put to the through-state when the clock signal CLK is at the L level and therefore each is given a symbol $\overline{CK}$.

Assuming the signal waveform at each node of FIG. 11 is the same as the waveform of the clock signal CLK' of FIG. 5, it becomes entirely the same as that of FIG. 6 or 7. The argument on the first embodiment described with reference to FIGS. 5, 6 and 7 is also applicable in this case. In other words, read cycle time can be made shorter than the access time as far as the memory in this embodiment is concerned and, even when the phase of the clock signal CLK shifts or the delay time of the signal in the circuit block varies, there is no fear of the possibility of the generation of the output signal in a cycle different from the cycle in which it should be generated. Moreover, the travel time of the signal from the address input terminal up to the data output terminal can be shortened. The write cycle time can also be made shorter than the sum of the delay time from the write control signal input terminal or data input terminal up to the memory cell and the switching time of the memory cell. Even when the phase of the clock signal CLK shifts or the delay time of the signal in the write circuit varies, there is no fear of the possibility of the generation of the output signal in a cycle different from the cycle in which it should be generated. When some data is written to a certain address, it is only necessary to feed an address input signal, a write control signal and input data to the address input terminal, the write control signal input terminal and the data input terminal in the same cycle without worrying about the operation inside the memory.

Since only the clock signal CLK is required in this embodiment, a circuit (inverter 12) for generating clock signals in inverse phase in FIG. 5 is unnecessary. The circuit is further simplified.

Figure 12:
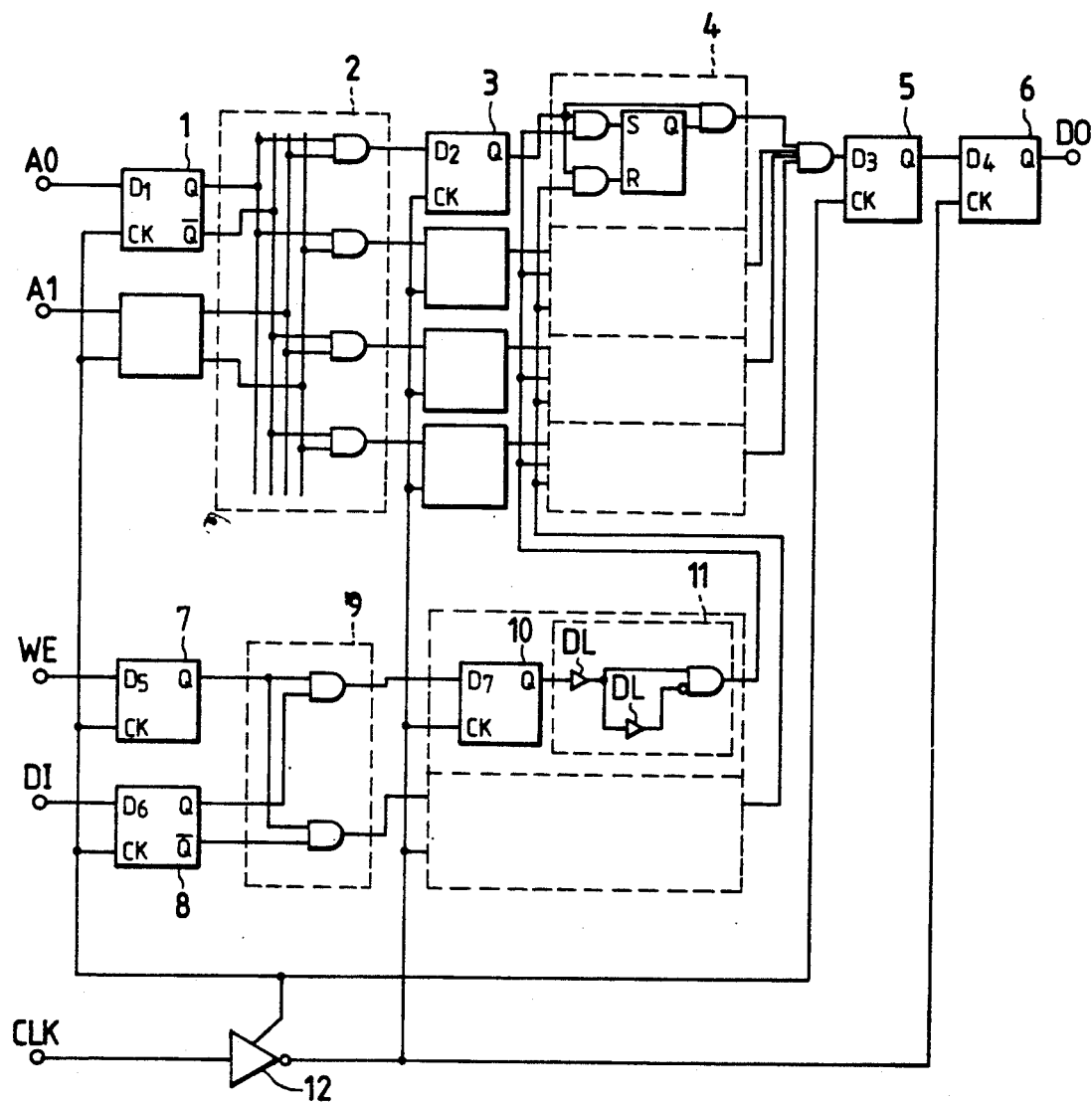
FIG. 12 is a block diagram of a pipelined memory as a 5th embodiment of the present invention using a logic gate.

FIG. 12 is a block diagram of a 5th embodiment of the present invention, wherein the decoder 2, the memory cell array 4, the write amplifier 9 and the write pulse generator 11 are formed with specific logic gates.

In this embodiment, the decoder 2 is formed with four AND gates and each memory cell in the memory cell array is formed with three AND gates and SR flip flops. The write amplifier 9 is formed with two AND gates and the write pulse generator 11 is formed with two delay circuits DL and an AND gate having a negative input.

The delay circuit DL at the first stage of the write pulse generator 11 is a circuit for regulating the setup time of the write pulse signal relative to the cell selection signal at the time of writing, whereas the delay circuit DL at the second stage is a circuit for regulating the pulse width of the write pulse signal at the time of writing.

Figure 13:
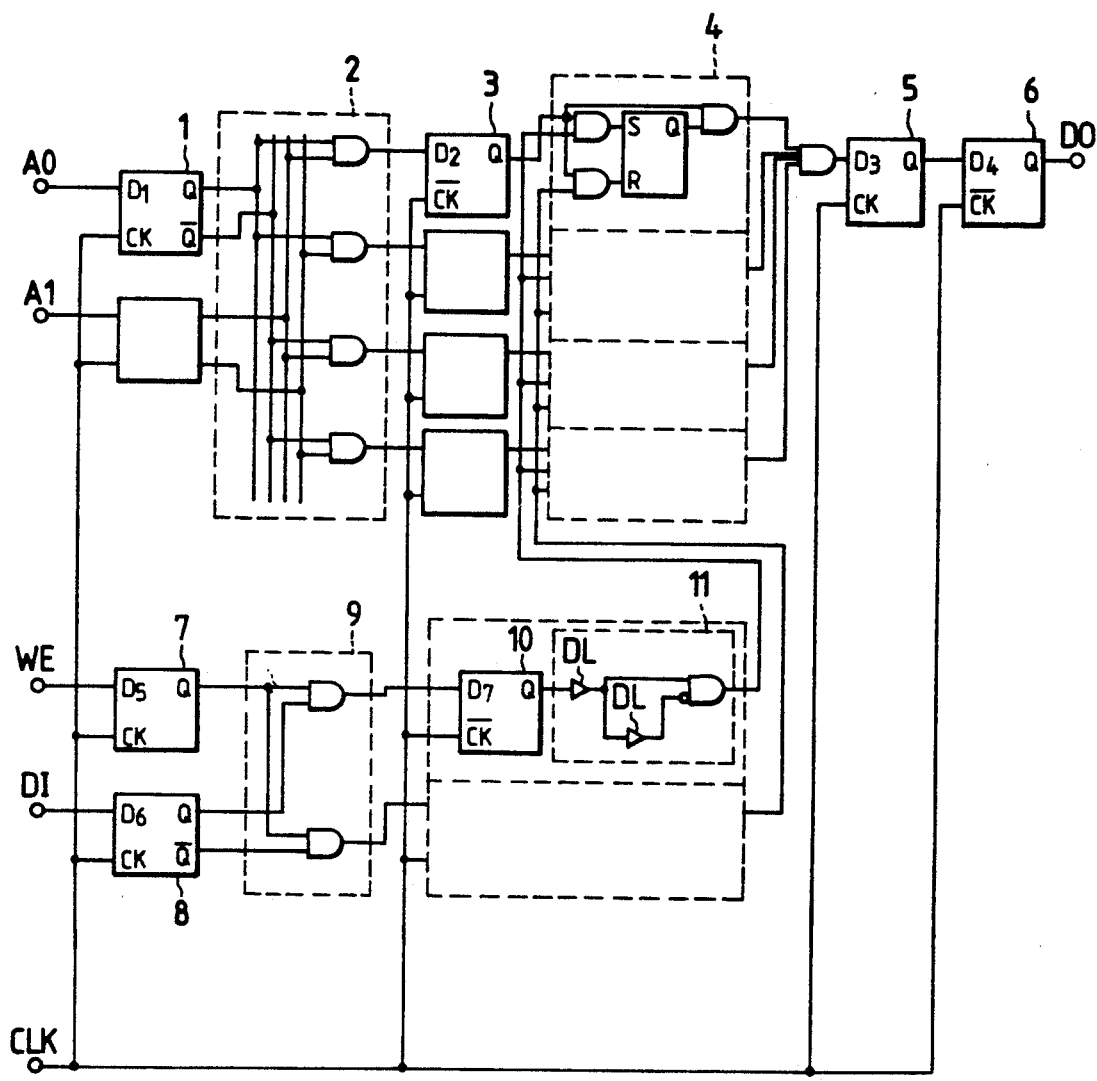
FIG. 13 is a block diagram of a pipelined memory as a 6th embodiment of the present invention using a logic gate.

FIG. 13 is a block diagram of a 6th embodiment of the present invention, wherein the decoder 2, the memory cell array 4, the write amplifier 9 and the write pulse generator 11 shown in FIG. 11 are formed with specific logic gates as in the case of what is shown in FIG. 12.

Figure 14:
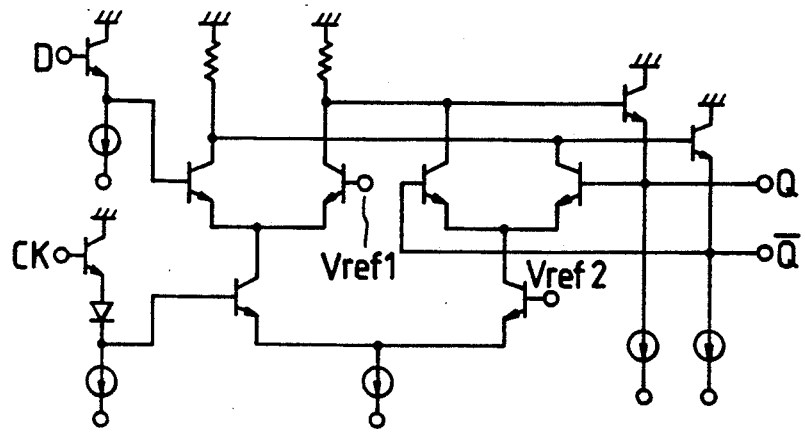
FIG. 14 is a circuit diagram of a latch circuit as a 7th embodiment of the present invention.

FIG. 14 is a circuit diagram of a 7th embodiment of the present invention, wherein the circuit with the symbol CK attached to the clock signal input terminal among the latch circuits shown by the D-type flip flops in FIGS. 11, 12 and 13, i.e. the latch circuit put to the through-state when the clock signal is at the H level, is constructed of bipolar transistors, diodes, resistors and current sources.

In FIG. 14, there is shown an arrangement of a data input terminal D of the latch circuit, output terminals Q, $\overline{Q}$, an input terminal CK of the clock signal for controlling the through- and holds state of the latch circuit, and reference potentials Vref1, Vref2.

Figure 17:
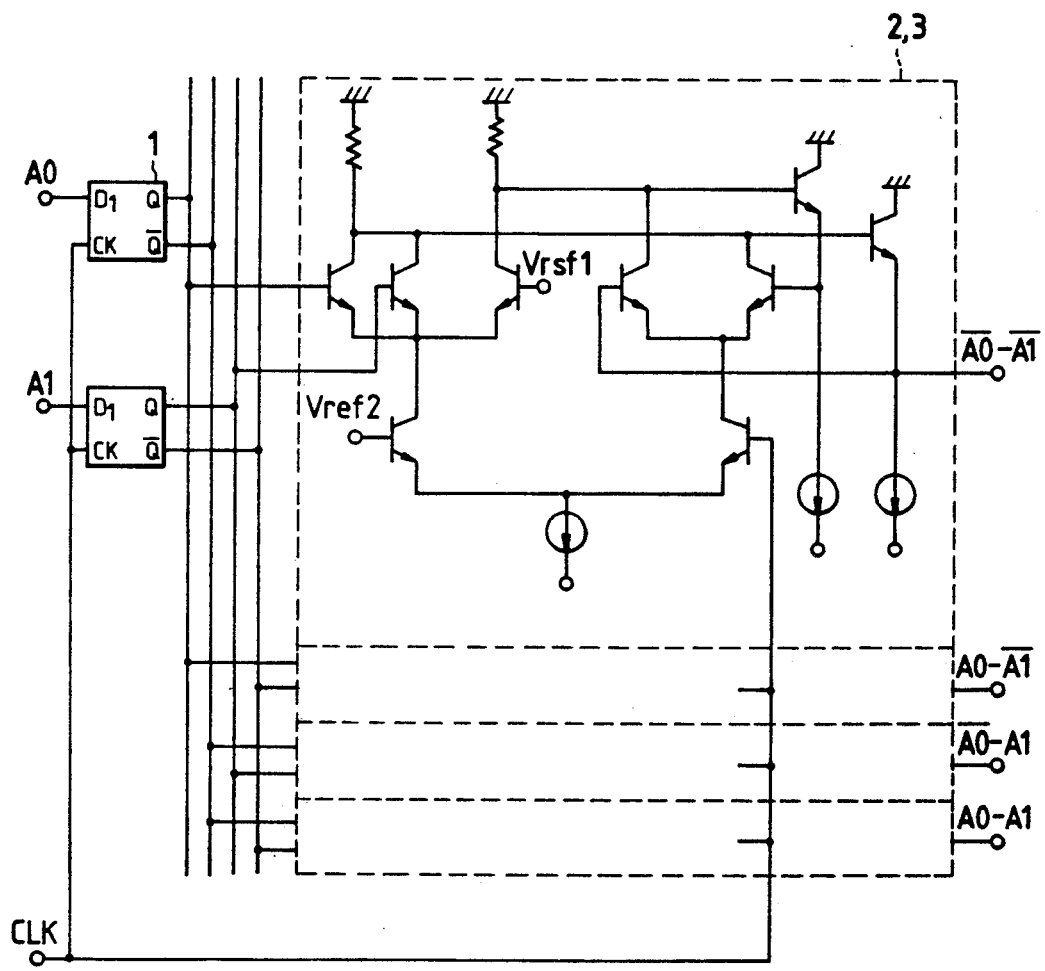
FIG. 17 is a circuit diagram of a decoder/driver as a 10th embodiment of the present invention.

A detailed description has already been given of the operational theory of this circuit with reference to FIG. 17 in Japanese Patent Laid-Open No. 29213/1986. FIG. 14 shows the basic arrangement of the latch circuit, wherein e.g. a level shift circuit may be inserted at a necessary node for the prevention of saturation of the bipolar transistor, whereas the emitter follower (a diode connected to the emitter of a transistor whose base is to receive the data D or clock signal CK, or transistor whose base is to receive the clock signal CK) at the output stage or emitter follower (a transistor whose emitter is to output data Q or $\overline{Q}$ in FIG. 14) at the output stage. The above-described arrangement may also be made in the following embodiment.

Figure 15:
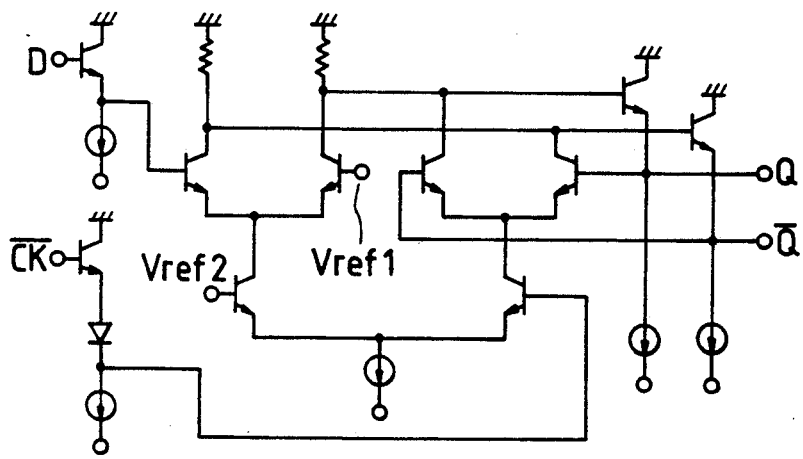
FIG. 15 is a circuit diagram of a latch circuit as a 8th embodiment of the present invention.

FIG. 15 is a circuit diagram of a 8th embodiment of the present invention, wherein the circuit with the symbol $\overline{CK}$ attached to the clock signal input terminal among the latch circuits shown by the D-type flip flops in FIGS. 11 and 13, i.e. the latch circuit put to the through-state when the clock signal is at the L level, is constructed of bipolar transistors, diodes, resistors and current sources.

In FIG. 15, the clock signal input terminal $\overline{CK}$ is used for controlling the through- and hold-states of the latch circuit, the remainder being the same as what is shown in FIG. 14.

Figure 16:
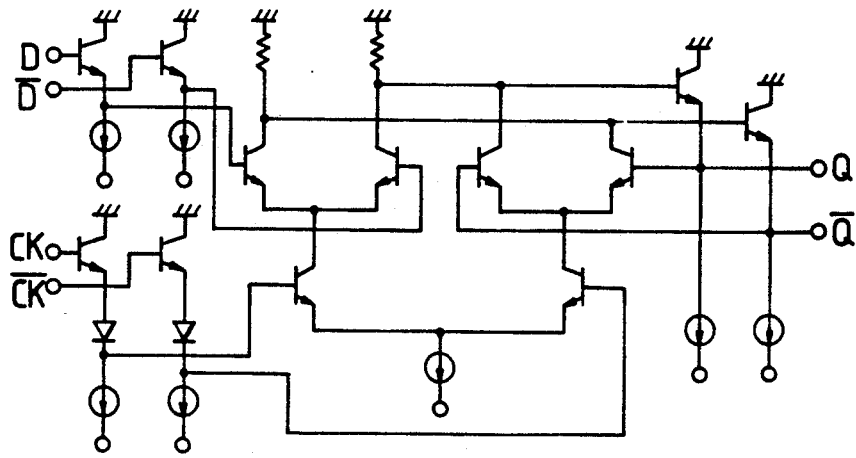
FIG. 16 is a circuit diagram of a latch circuit as a 9th embodiment of the present invention.

FIG. 16 is a circuit diagram of a 9th embodiment of the present invention, wherein another example of the latch circuit is constructed of bipolar transistor, diodes, resistors and current sources.

This embodiment features the data and clock signals supplied to the latch circuit as differential signals; i.e. D and $\overline{D}$ designate differential data signal input terminals; and CK and $\overline{CK}$ designate differential clock signal input terminals, the remainder being the same as what is shown in FIG. 14.

The reason for making the data and clock signals differential signals is that a signal in the form of a differential signal normally makes it possible to reduce its amplitude. The advantage is that the delay time of the signal can be shortened to that extent.

FIG. 17 is a circuit diagram of a 10th embodiment of the present invention, wherein the decoder 2 and the driver 3 of FIG. 11 are constructed of bipolar transistor, diodes, resistors and current sources so that they can be provided with the latch function when the clock signal is put to the hold-state at its H level.

A detailed description has already been given of the operational theory of this circuit with reference to FIG. 7 in Japanese Patent Laid-Open No. 304998/1987. This operational theory is also applicable to a case where the decoder 2 and the driver 3 of FIG. 5 are constructed of bipolar transistors, diodes, resistors and current sources so that they can be provided with the latch function when the clock signal is put to the through-state at its H level.

Figure 18:
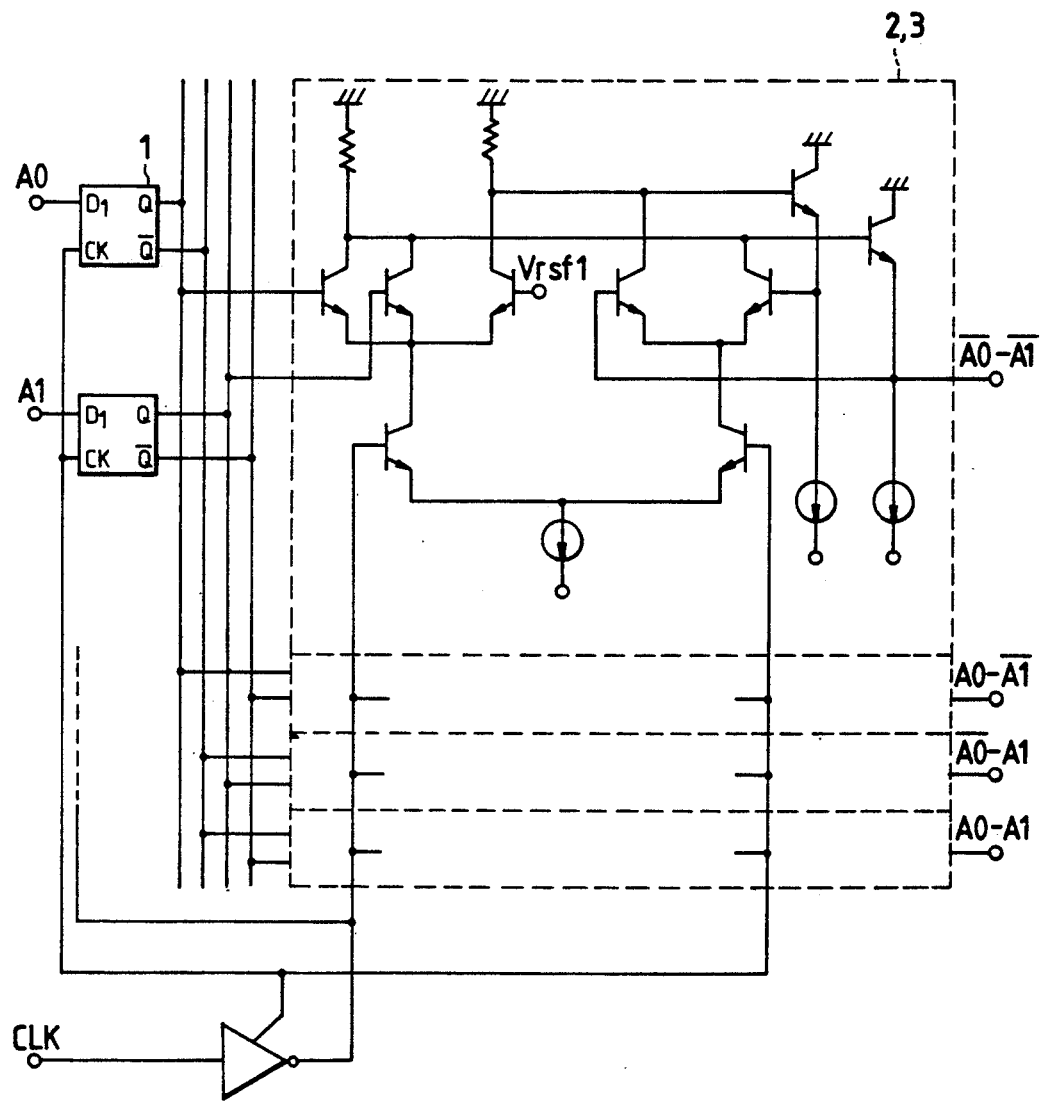
FIG. 18 is a circuit diagram of a decoder/driver as a 11th embodiment of the present invention.

FIG. 18 is a circuit diagram of a 11th embodiment of the present invention, wherein the decoder 2 and the driver 3 are constructed of bipolar transistors, diodes, resistors and current sources so that they can be provided with the latch function as another example of the sort mentioned above.

This embodiment features the latch decoder and clock signals supplied to the driver as differential signals. The delay time of the signal can be shortened in this manner as described in FIG. 16. The clock signal fed to the latch address buffer may be made a differential signal as shown by a broken line of FIG. 18.

Figure 19A:
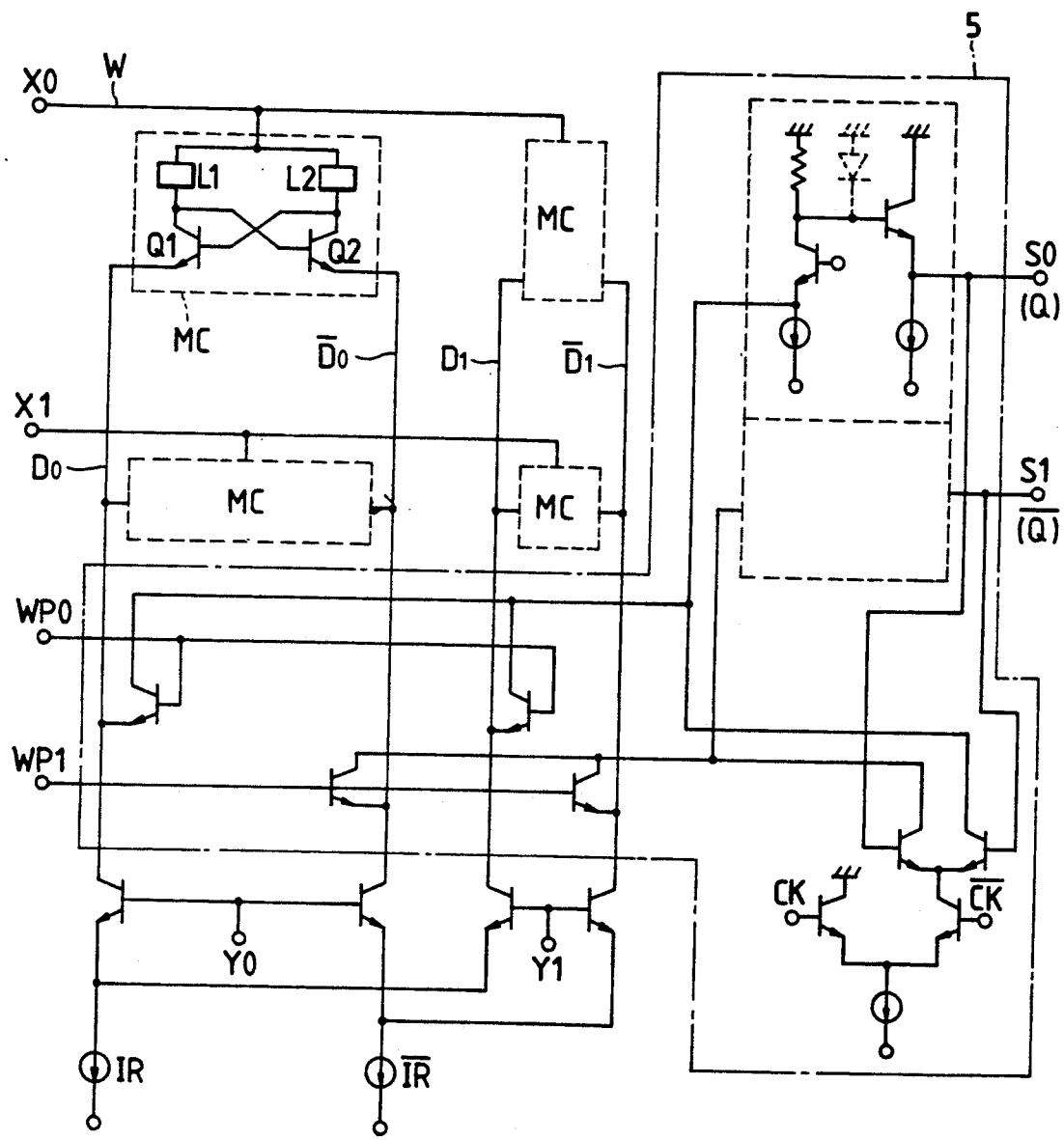
FIG. 19(a) and 19(b) circuit illustrate diagrams of a sense circuit and a modification thereof as a 12th embodiment of the present invention.
Figure 19B:
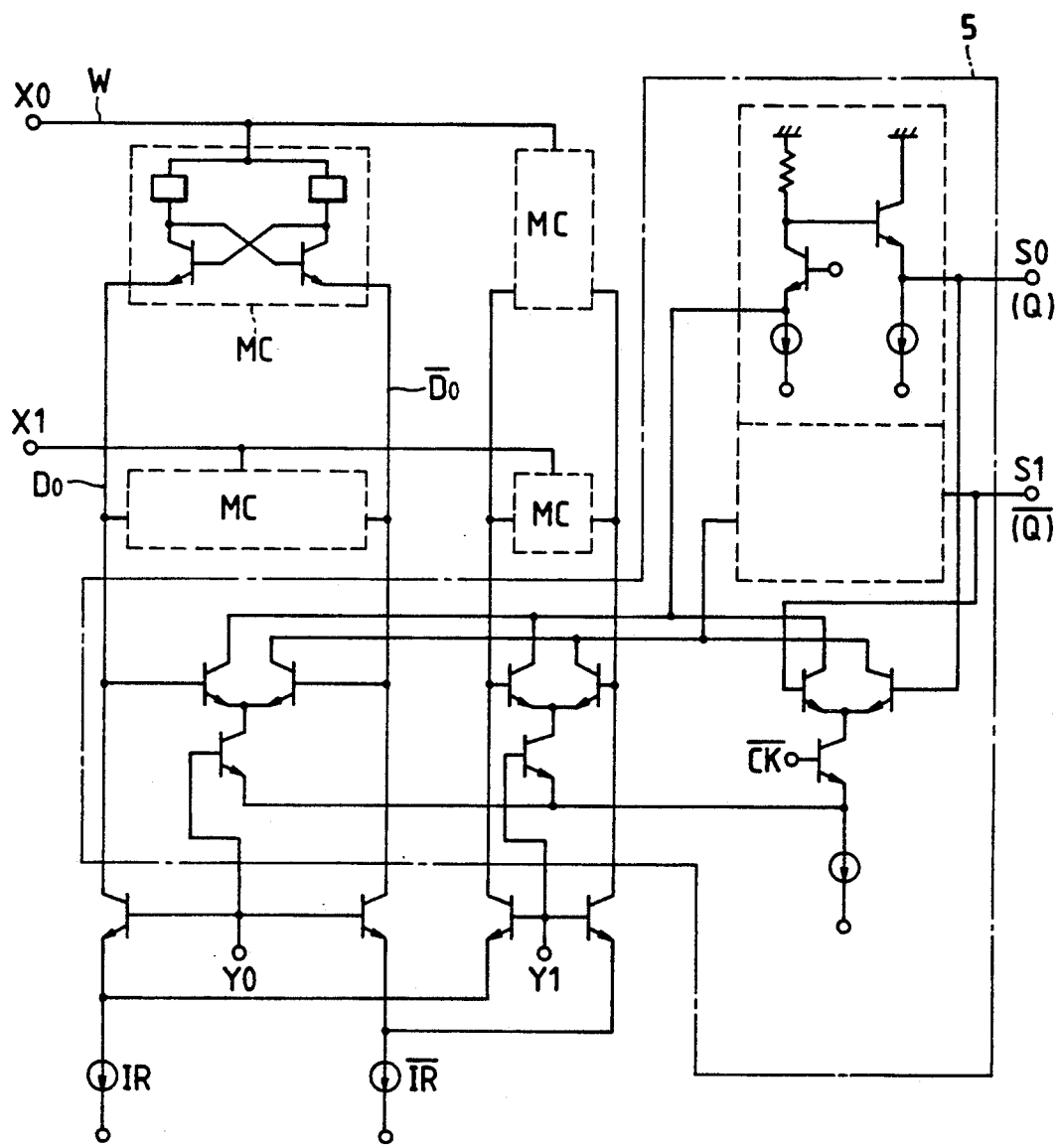

FIGS. 19a, 19b show circuit diagrams of a 12th embodiment of the present invention, wherein the sense circuit 5 is constructed of bipolar transistors, resistors and current sources so that they can be provided with the latch function.

In FIG. 19a, the clock signal fed to the sense circuit is made a differential signal and provided with the latch function so that the clock signal CK is put to the through-state at its H level. A detailed description has been given of the operational theory of this circuit with reference to FIG. 8 in, e.g. Japanese Patent Laid-Open No. 60377/1988.

In FIG. 19b, the sense circuit is provided with the latch function when the clock signal $\overline{CK}$ is put to the hold-state at its H level. In FIG. 19b, there is omitted a write transistor whose base receives write pulses WP0, WP1, whose emitter is connected to the bit line and whose collector is grounded. A detailed description has be given of the operational theory of this circuit with reference to FIG. 1 in, e.g. Japanese Patent Laid-Open No. 60377/1988.

In order to provide the circuit of FIG. 19b with the latch function in such a manner that, like the sense circuit of FIG. 5, 11, 12 or 13, it is put to the through-state at its H level, an inverter should be inserted at the preceding stage of the clock signal input terminal shown by $\overline{CK}$ of FIG. 19b.

The aforementioned inverter will become unnecessary if the relation between the clock signals CLK' and $\overline{CLK'}$ in FIGS. 5, 12 or between the latch circuits CK and $\overline{CK}$ in FIGS. 11, 13 is inverted.

Figure 20:
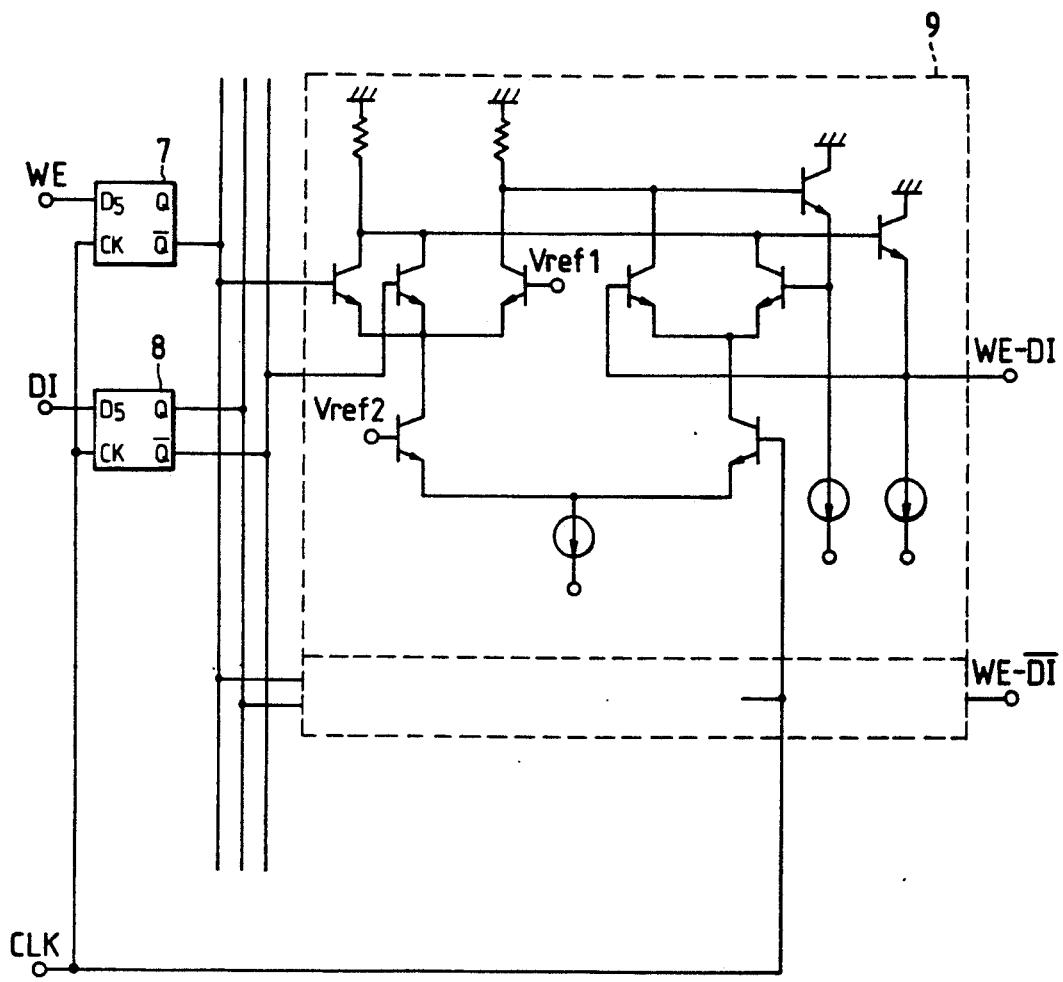
FIG. 20 is a circuit diagram of a write amplifier including a latch circuit at the preceding stage of a write pulse generator as a 13th embodiment of the present invention.

FIG. 20 is a circuit diagram of a 13th embodiment of the present invention, wherein the write amplifier 9 and the latch circuit at the preceding stage of the write pulse generator 11 of FIG. 5 or 11 are constructed of bipolar transistors, resistors and current sources.

In this embodiment, the write amplifier 9 is converted into series gates so that it is provided with the latch function. Although the latch function is provided so that the hold-state is established when the clock signal CLK is at the H level in this embodiment, it may be provided so that the through-state is established when the clock signal CLK is at the H level. The operational theory of this circuit is similar to what is shown in FIG. 17 in that the through-state is established when the clock signal CLK is switched to the L level. The output signal of the write amplifier 9 is switched in compliance with the output data of the WE buffer 7 and the DI buffer 8. Moreover, the hold-state is established when the clock signal CLK is switched to the H level but the output signal of the write amplifier 9 is not switched even when the output data of the WE buffer and the DI buffer 8 are switched.

Figure 21:
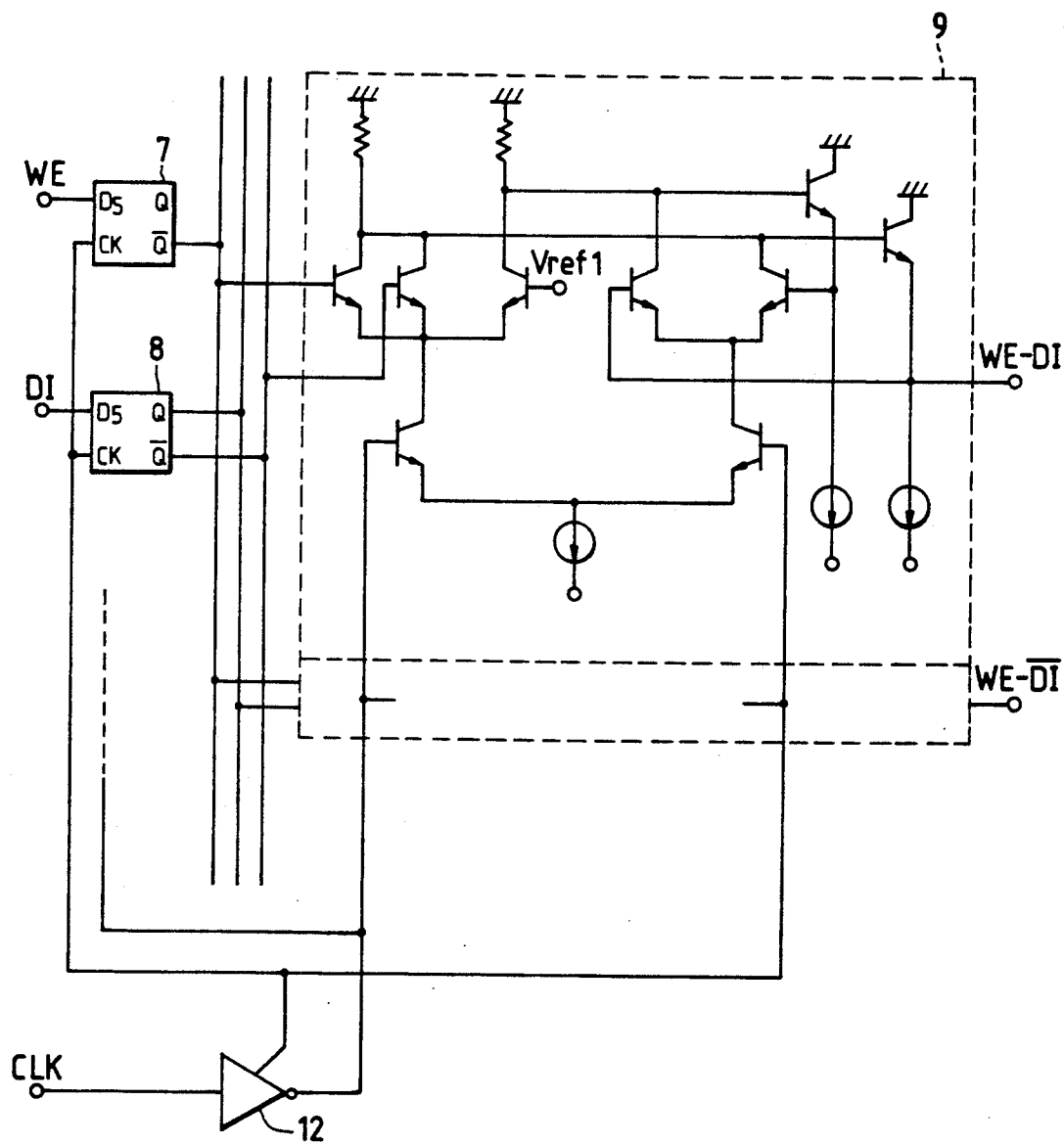
FIG. 21 is a circuit diagram of a write amplifier including a latch circuit at the preceding stage of a write pulse generator as a 14th embodiment of the present invention.

FIG. 21 is a circuit diagram of a 14th embodiment of the present invention, wherein the write amplifier 9 and the latch circuit at the preceding stage of the write pulse generator 11 of FIG. 5 or 11 are constructed of bipolar transistors, resistors and current sources.

This embodiment features the clock signal supplied to the write amplifier as a differential signal. The delay time of the signal can be shortened in this manner as described in FIG. 16. The clock signal fed to the latch WE buffer 7 or DI buffer 8 may be made a differential signal as shown by a broken line of FIG. 21.

Figure 22:
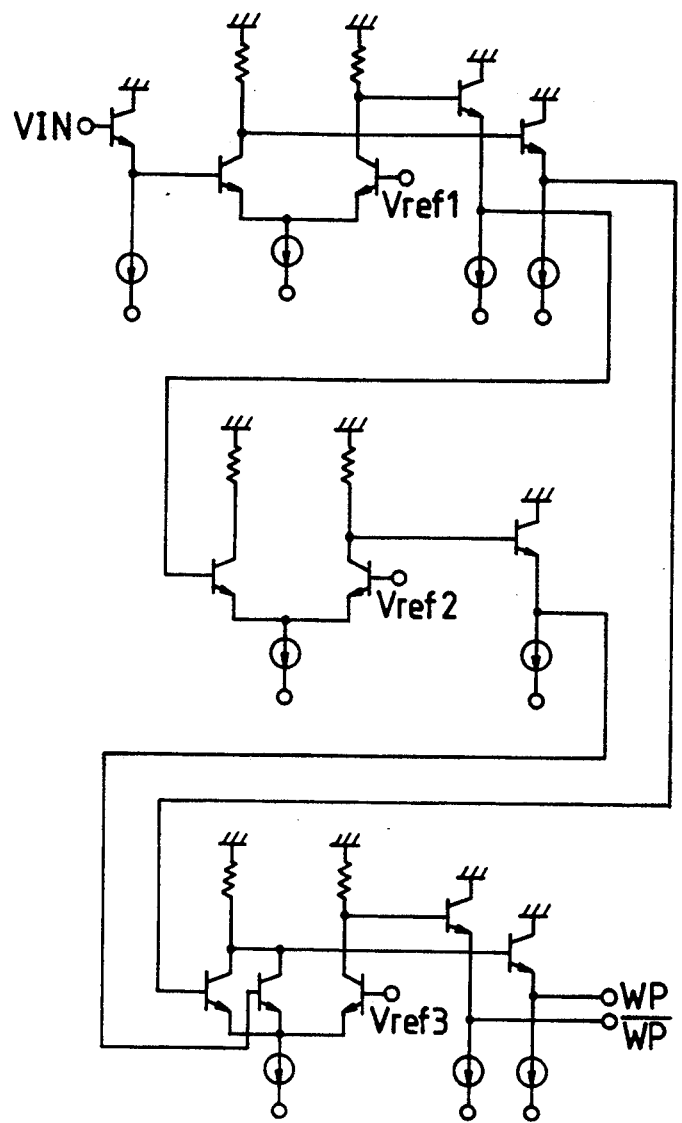
FIG. 22 is a circuit diagram of a write pulse generator as a 15th embodiment of the present invention.

FIG. 22 is a circuit diagram of a 15th embodiment of the present invention, wherein the write pulse generator 11 of FIG. 5 or 11 is constructed of bipolar transistors, resistors and current sources.

In FIG. 22, a terminal VIN receives the output data of the latch circuit 10 at the preceding stage of the write pulse generator; Vref1, Vref2, Vref3 are reference potentials; and WP, $\overline{WP}$ are write pulse signals generated by the write pulse generator 11. A current switch shown at the upper stage of FIG. 22 is a delay circuit for regulating the setup time of the write pulse signal relative to the cell selection signal at the time of writing, whereas a current switch shown at the mid-stage thereof is a delay circuit for regulating the pulse width of the write pulse signal at the time of writing. An OR gate shown at the lower stage thereof is a circuit for generating the write pulse signals WP, $\overline{WP}$ in compliance with the output signals of the two current switches.

Figure 23:
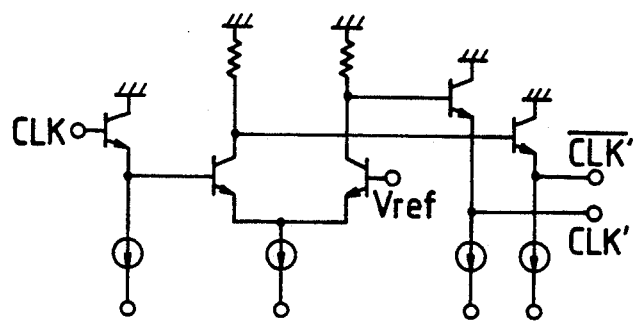
FIG. 23 is a circuit diagram of an inverter as a 16th embodiment of the present invention.

FIG. 23 is a circuit diagram of a 16th embodiment of the present invention, wherein the inverter 12 for generating the clock signal CLK' in inverse phase of FIG. 5 or 12 is constructed of bipolar transistors, resistors and current sources.

FIGS. 24a-24d are circuit diagrams of a 17th embodiment of the present invention, wherein the memory cell in the memory cell array of FIG. 5 or 11 is constructed of bipolar transistors, resistors or SBDs (Schottky Barrier Diodes) or diodes.

Figure 24A:
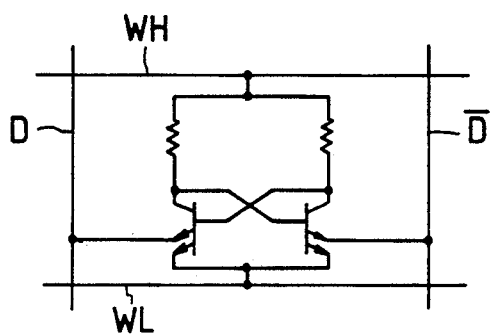
FIG. 24(a)–24(d) are circuit diagrams of memory cells as a 17th embodiment of the present invention.
Figure 24C:
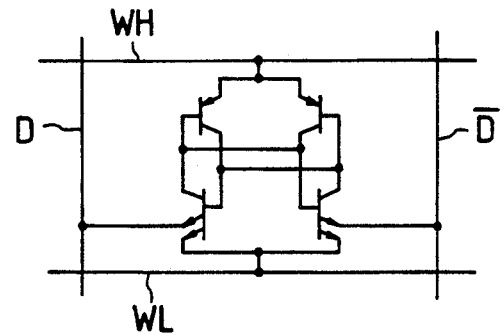
Figure 24B:
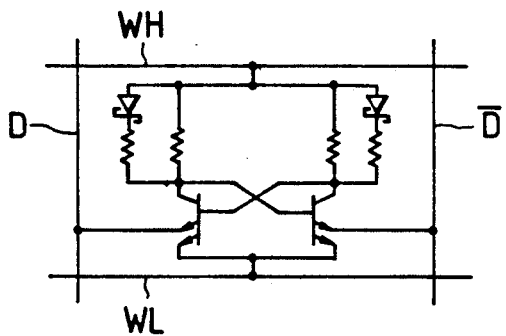
Figure 24D:
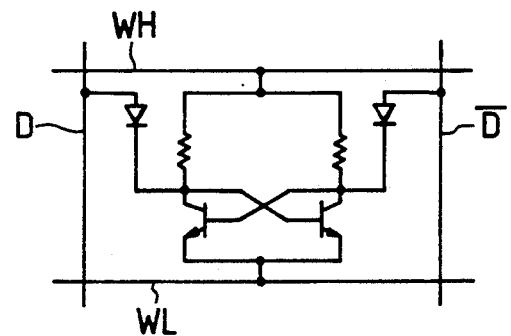

The memory cell shown in FIG. 24a is a memory cell of a resistance load type; what is shown in FIG. 24b is a memory cell of a load switch type for resistance-to-SBD load switching by means of the drive current of the memory cell; what is shown in FIG. 24c is a memory cell of a PNP transistor load type; and what is shown in FIG. 24d is a memory cell of a diode coupling type.

The memory cell basically comprising the bipolar transistors shown in this embodiment is an example thereof and any other memory cell is also usable therein.

Figure 25:
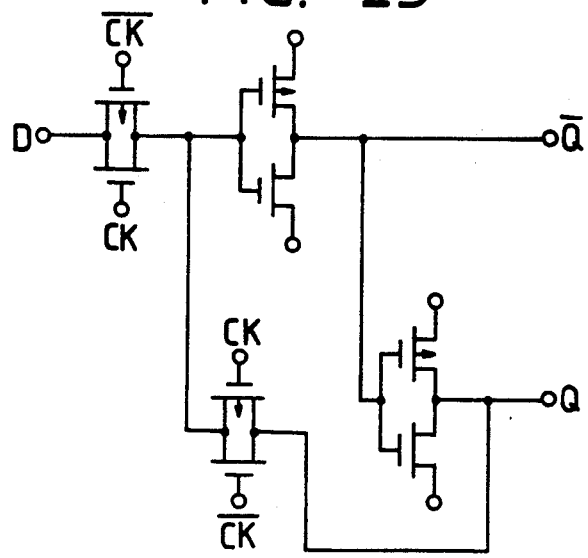
FIG. 25 is a circuit diagram of another latch circuit as a 18th embodiment of the present invention.

FIG. 25 is a circuit diagram of a 18th embodiment of the present invention, wherein the inverter (buffer) of the CMOS is provided with the latch function.

This circuit may be used as a latch circuit shown in the D-type flip flop of FIGS. 5, 11, 12 and 13. In this case, as shown in FIG. 25, D designates a data input terminal of the latch circuit; Q, $\overline{Q}$ data output terminals; and CK, $\overline{CK}$ input terminals of the differential clock signal.

Figure 26:
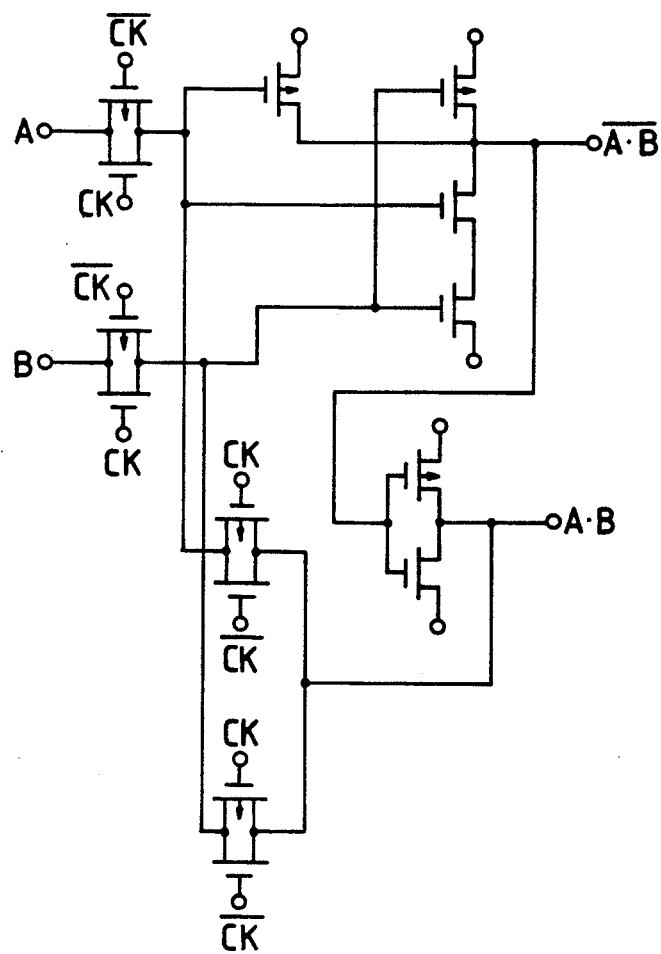
FIG. 26 is a circuit diagram of a NAND (AND) gate as a 19th embodiment of the present invention.

FIG. 26 is a circuit diagram of a 19th embodiment of the present invention, wherein the NAND (AND) gate of the CMOS is provided with the latch function.

As is obvious from FIGS. 12 and 13, this circuit may be used in various places of the memory, including the decoder, the sense circuit, the write amplifier, the write pulse generator and the like.

Figure 27:
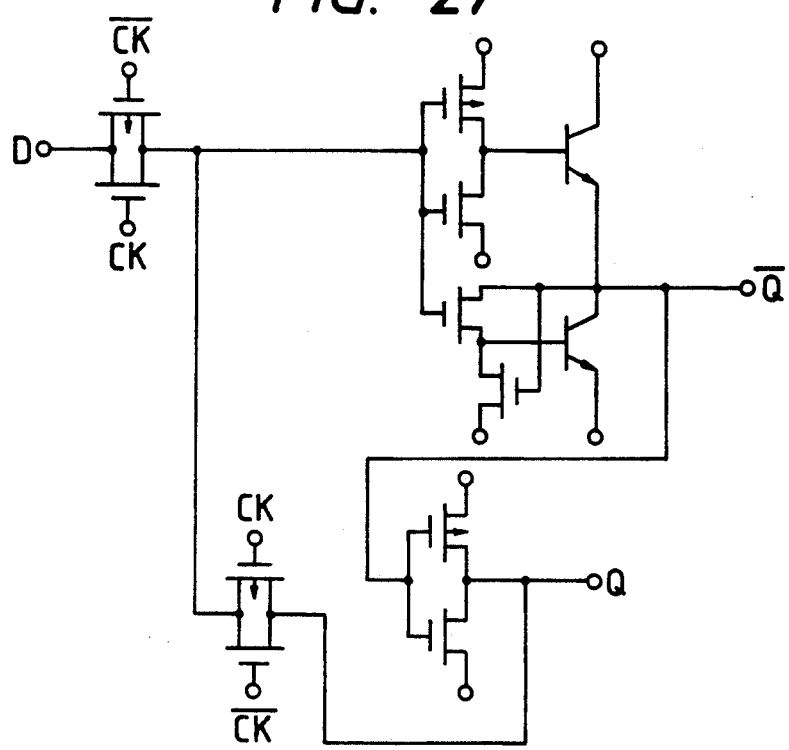
FIG. 27 is a circuit diagram of still another latch circuit as a 20th embodiment of the present invention.

FIG. 27 is a circuit diagram of a 20th embodiment of the present invention, wherein the inverter (buffer) of the BiCMOS is provided with the latch function.

This circuit may be used as a latch circuit shown in the D-type flip flop of FIGS. 5, 11, 12 and 13. In this case as shown in FIG. 27, D designates a data input terminal of the latch circuit; Q, $\overline{Q}$ data output terminals; and CK, $\overline{CK}$ input terminals of the differential clock signal.

Figure 28:
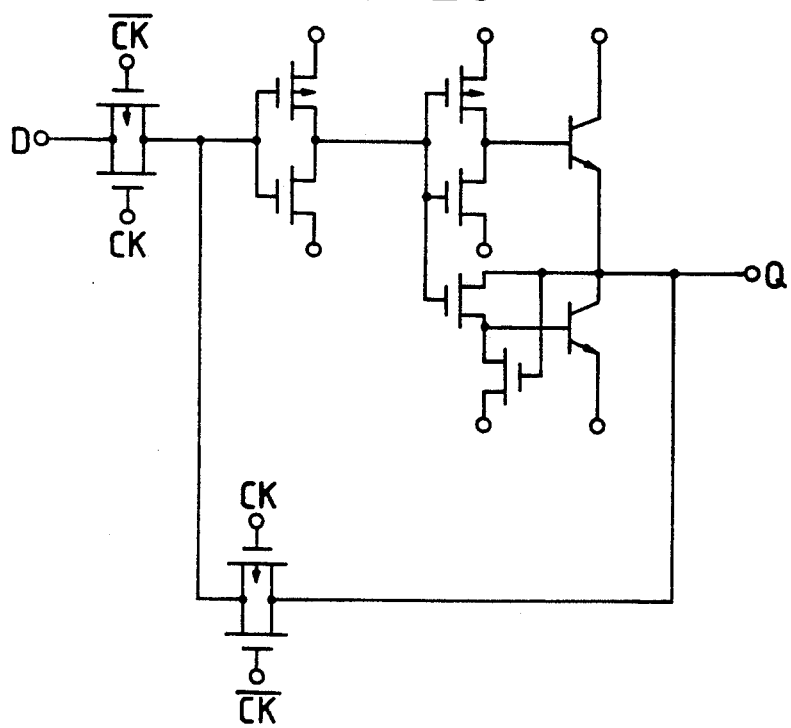
FIG. 28 is a circuit diagram of still another latch circuit as a 21st embodiment of the present invention.

FIG. 28 is a circuit diagram of a 21st embodiment of the present invention, wherein the inverter (buffer) of the BiCMOS is provided with the latch function as another example.

This circuit may also be used as a latch circuit shown in the D-type flip flop of FIGS. 5, 11, 12 and 13. In this case as shown in FIG. 28, D designates a data input terminal of the latch circuit; Q, a data output terminal; and CK, $\overline{CK}$ input terminals of the differential clock signal.

Figure 29:
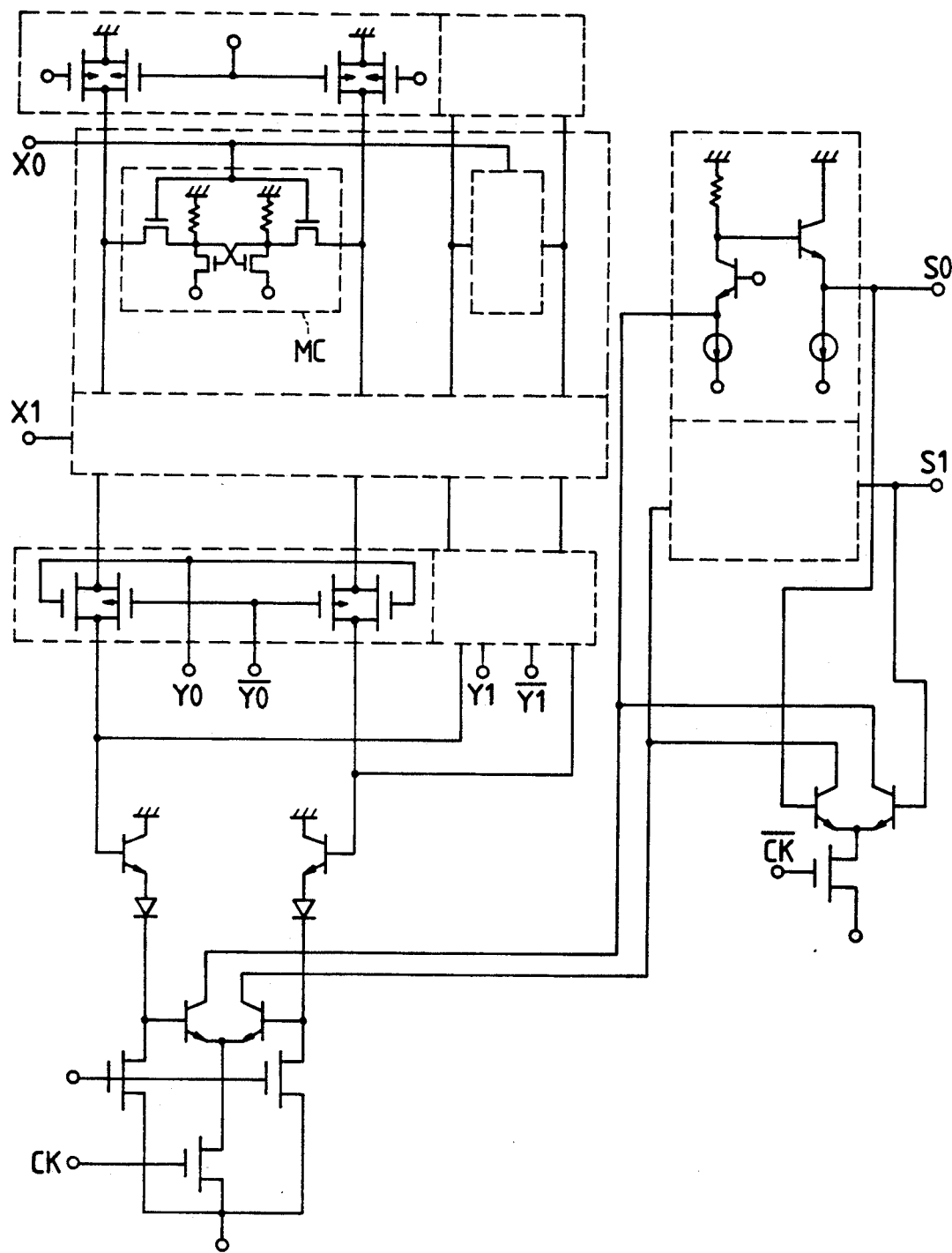
FIG. 29 is a circuit diagram of another sense circuit as a 22nd embodiment of the present invention.

FIG. 29 is a circuit diagram of a 22nd embodiment of the present invention, wherein the memory cell formed with the MOS and the sense circuit formed with the BiMOS are provided with the latch function.

In this embodiment, the clock signal fed to the sense circuit is made a differential signal and the latch function is provided so that the through-state is established when the clock signal CK is at the H level.

Figure 30:
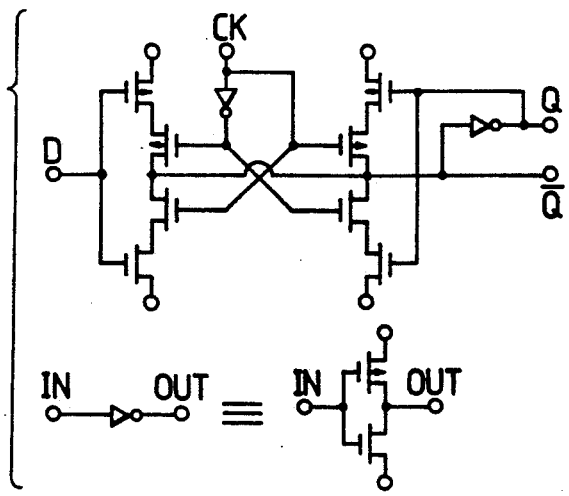
FIG. 30, is a circuit diagram of still another latch circuit as a 23rd embodiment of the present invention.

FIG. 30 is a circuit diagram of a 23rd embodiment of the present invention, wherein there is shown a latch circuit often having CMOS-DRAM, etc.

Of the latch circuits shown in the D-type flip flops of FIGS. 5, 11, 12 and 13, this circuit may be used as a latch circuit having the clock signal input terminal supplied with the symbol CK, i.e. the latch is put to the through-state when the clock signal is at the H level. In this case as shown in FIG. 30, D designates a data input terminal of the latch circuit; Q, $\overline{Q}$ data output terminals; and CK an input terminal of the clock signal.

Figure 31:
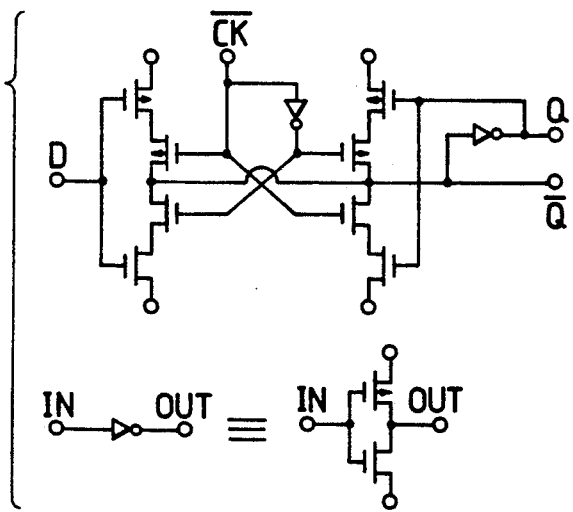
FIG. 31 is a circuit diagram of still another latch circuit as a 24th embodiment of the present invention.

FIG. 31 is a circuit diagram of a 24th embodiment of the present invention, wherein the latch circuit is constructed of the CMOS as another example.

Of the latch circuits shown in the D-type flip flops of FIGS. 5, 11, 12 and 13, this circuit may be used as a latch circuit having the clock signal input terminal supplied with the symbol $\overline{CK}$, i.e. the latch is put to the hold-state when the clock signal is at the H level. In this case as shown in FIG. 31, D designates a data input terminal of the latch circuit; Q, $\overline{Q}$ data output terminals; and $\overline{CK}$ an input terminal of the clock signal.

Figure 32:
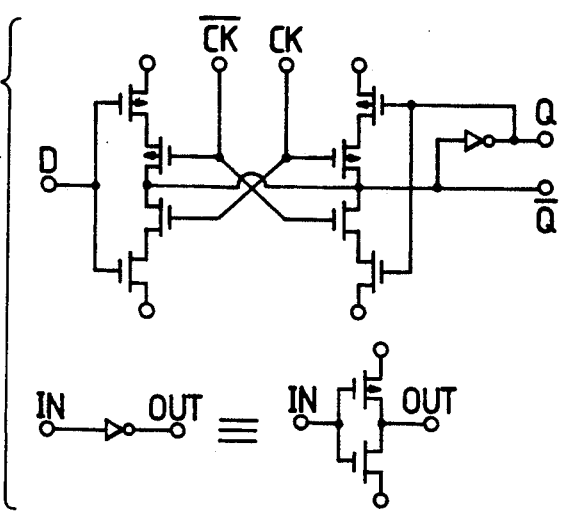
FIG. 32 is a circuit diagram of still another latch circuit as a 25th embodiment of the present invention.

FIG. 32 is a circuit diagram of a 25th embodiment of the present invention, wherein the latch circuit is constructed of the CMOS as still another example.

This embodiment features the clock signal supplied to the latch circuit as a differential signal; i.e. CK and $\overline{CK}$ in FIG. 32 designate differential clock signal input terminals, the remainder being entirely the same as what is shown in FIG. 31.

Although a description has been given of many examples of static RAMs using silicon semiconductors mainly such as bipolars, MOSs, BiCMOS, etc., the present invention is not limited to these applications but, needless to say, applicable to memories composed of semiconductors of those other than silicon such as semiconductors of III-V groups or devices other than semiconductors such as Josephson devices, or any other memory such as a static or dynamic memory, RAMs and ROMs as well.

As set forth above, the aforementioned embodiments have the effect of not only materializing a pipelined memory fit for increasing the memory drive cycle speed but also considerably facilitating the designing of timing of clock signals.

In other words, the present invention is capable of making the read cycle time shorter than the access time and obviating the problem of causing the output signal to be produced in a cycle different from the cycle in which it should be produced when the phase of the clock signal CLK shifts or the delay time of the signal in the circuit block varies. Moreover, the travel time of the signal from the address input terminal to the data output terminal can be shortened. Further, the write cycle time can be made shorter than the delay time from the write control signal input terminal or data input terminal up to the memory cell and the switching time of the memory cell. In addition, the present invention is capable of obviating the problem of causing the write pulse signal generated by the write pulse generator to be produced in a cycle different from the cycle in which it should be produced when the phase of the clock signal CLK shifts or the delay time of the signal within the write circuit varies. When some data is written to a certain address, it is only necessary to feed the address input signal, the write control signal and the input data to the address input terminal, the write control signal input terminal and the data input terminal, respectively, in the same cycle without worrying about the operation inside the memory.

Figure 33:
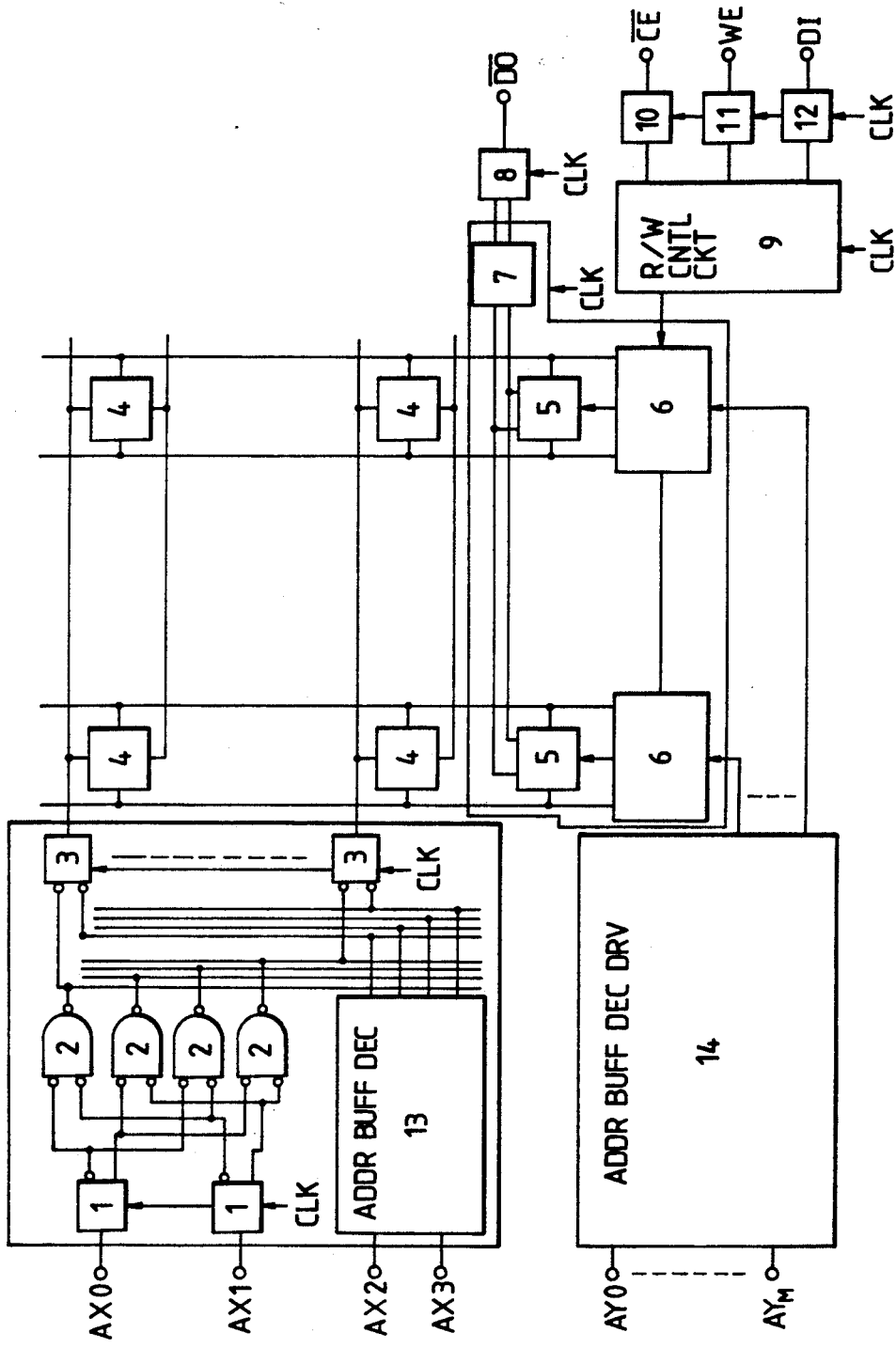
FIG. 33 is a block diagram illustrating a memory LSI as a 26th embodiment of the present invention.

FIG. 33 is a circuit diagram of a memory LSI as a 26th embodiment, wherein may latch circuits are incorporated in the memory LIS. Japanese Patent Laid-Open No. 128097/1983 discloses the use of these latch circuits having series gates. With this arrangement, however, the plurality of latch circuits disposed in the memory chip tend to operate without stability when the clock frequency is sharply changed.

In the 25th embodiment of the present invention, the peripheral circuits originally provided within the memory LSI for use as latch circuits are supplied with the master-slave latch function. In the embodiment of FIG. 33, the address buffer 1 stored with the clock, the decoder-divider 3, the sense circuit 7, the output buffer 8, the control and data buffer 10-12 and the read/write control circuit 9 are provided with the master-slave latch function. Since these circuits are supplied with the master-drive latch function, they can be operated synchronously with the clock, regardless of the clock frequency, even though the clock frequency is drastically changed below the highest operable frequency.

Figure 34:
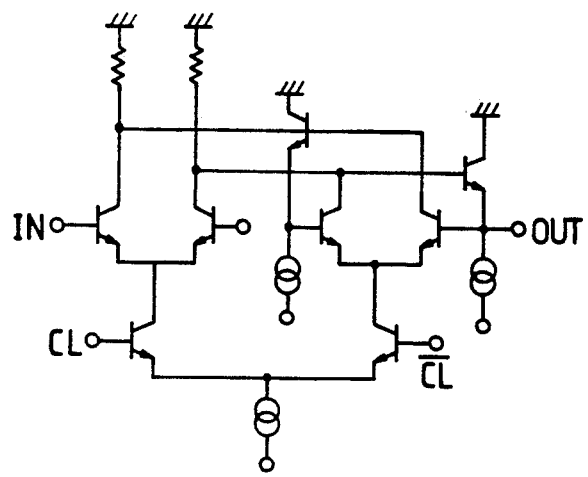
FIG. 34 is a circuit diagram of a latch circuit for use in the present invention.
Figure 35:
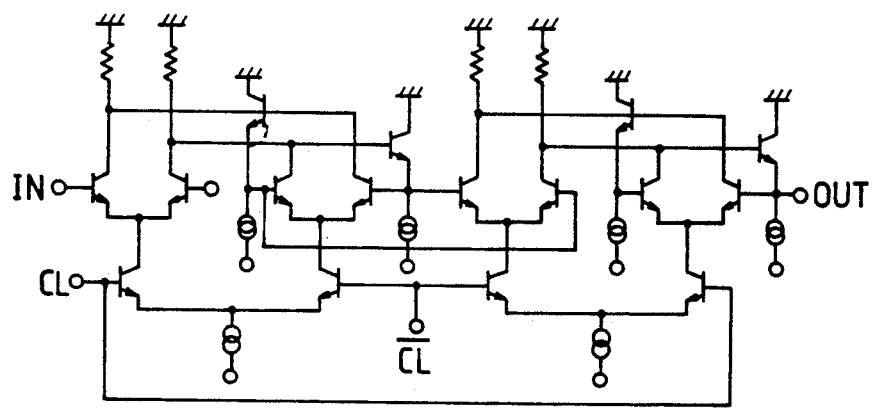
FIG. 35 is a circuit diagram of a master-slave latch circuit for use in the present invention.

FIG. 35 is a circuit diagram of a series gate latch circuit of FIG. 34 provided with the master-slave latch function.

In FIG. 35, the clock signal in inverse phase is supplied to the series circuits of FIG. 34 to have the master-slave operation performed.

The embodiment shown in FIG. 35 is applicable to the circuits 1, 33, 10-12 of FIG. 3.

Figure 36:
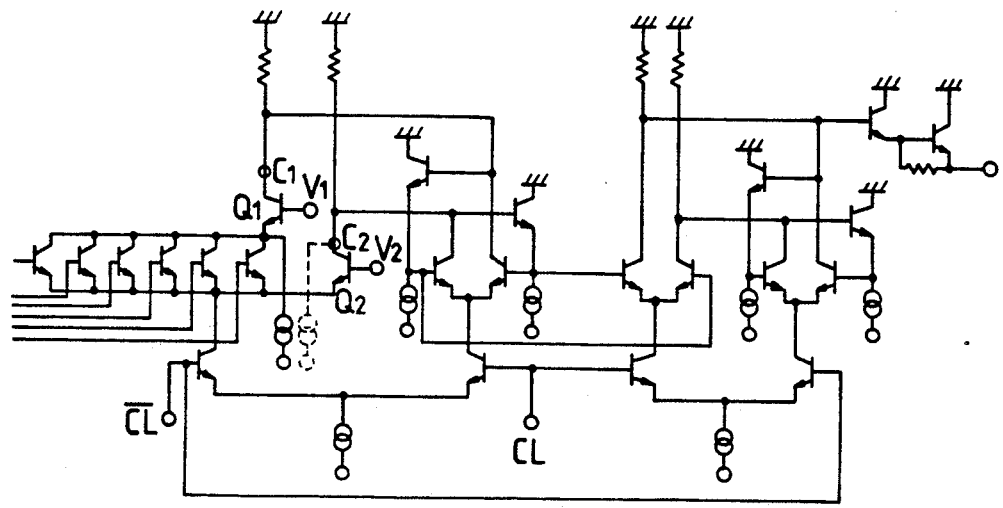
FIG. 36 is a circuit diagram of a master-slave latch circuit fit for use in the decoder circuit.

FIG. 36 is a circuit diagram of a master-slave latch circuit fit for used in the decoder-driver 3. In this latch circuit, a multi-input logic circuit is provided with the latch function to perform decoding.

A transistor Q1 in FIG. 36 is a transistor whose emitter is connected to the collectors of transistors for dealing with a number of inputs and whose base is supplied with a constant potential V1, whereby the collector potentials of the plurality of input transistors are clamped to minimize the fluctuations of the potentials and at the same time to increase the speed thereof.

In other words, a current of I1 is supplied from the constant current source to Q1 to decrease the fluctuations of the collector potentials of the multi-input transistor.

The connection diagram shown by a broken line between the collector C2 of a transistor Q2 in FIG. 36 means that the circuit may be inserted, provided the same potential drop as a potential drop on the NOR side (the potential drop of the collector C1 of the transistor Q1) is necessary to provide on the OR side (C2 side of the transistor Q2).

A constant potential V2 is supplied to the base of the transistor Q2.

Figure 37:
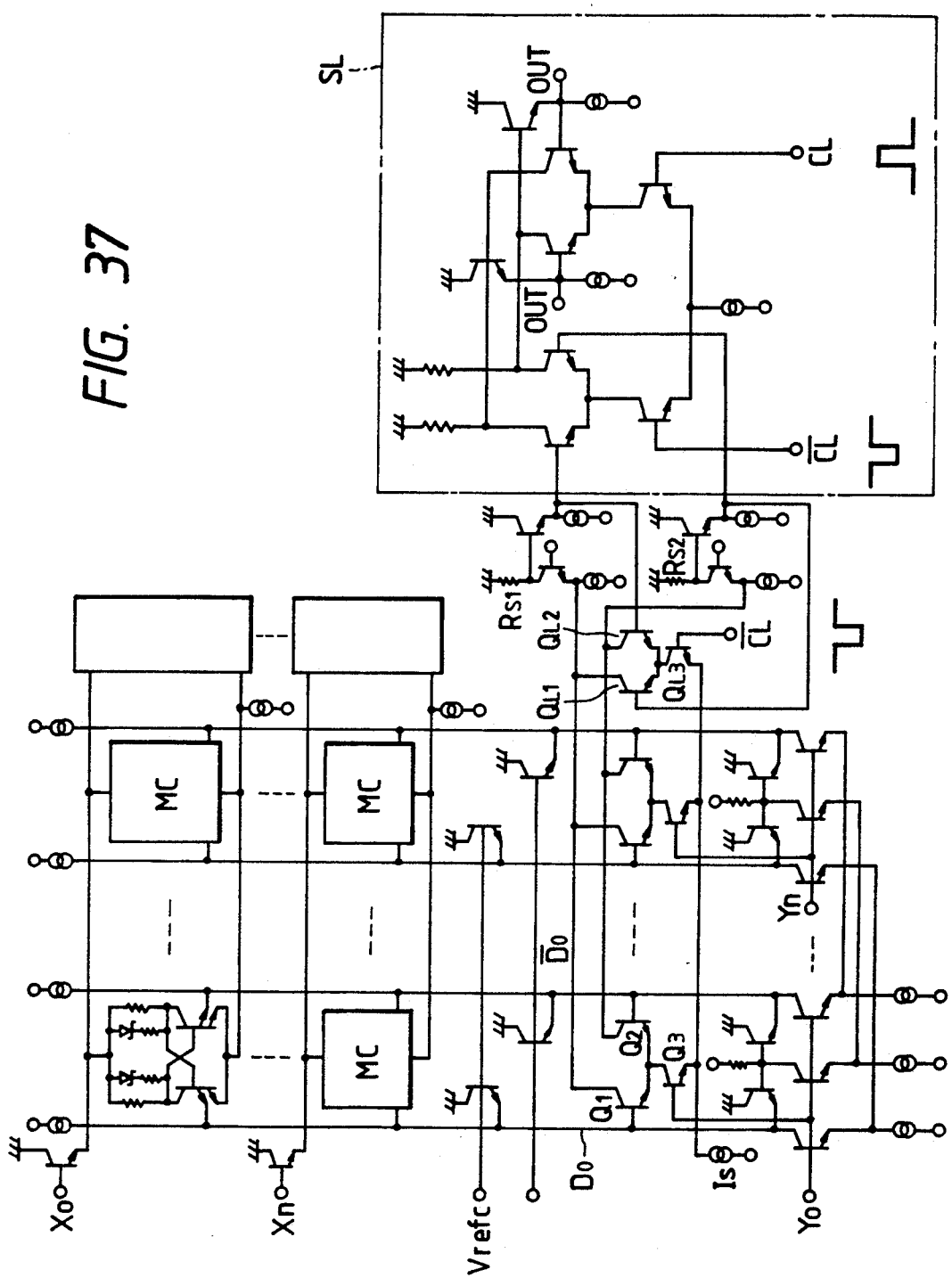
FIG. 37 is a circuit diagram of a master-slave latch circuit fit for use in the sense circuit.

FIG. 37 is a circuit diagram of a master-slave latch circuit fit for use as the sense circuit with the arrangement of the word line, the pair of digit . and the memory cell of FIG. 33. In FIG. 37, Q1, Q2, Q3, etc. form sense amplifiers and only the sense amplifier corresponding to the signal selected from among the digit line selection signals Yo-Yn operates, whereas sense outputs appear in resistors Rs1, Rs2 as differential signals. QL1, QL2, QL3 form flip flops constituting a master latch in combination with the sense amplifier and latch the signal when $\overline{CL}$ becomes the high level. The portion enclosed with an alternate long and short dash line is equivalent to a slave latch circuit SL and operates likewise as shown in FIG. 35.

Although a description has been given of the latch circuit in the bipolar memory, the similar arrangement is also applicable to a memory combining MOS and BiCMOS memories, i.e. bipolar and CMOS memories.

These memories have an internal construction similar to what is shown in FIG. 33.

Figure 38:
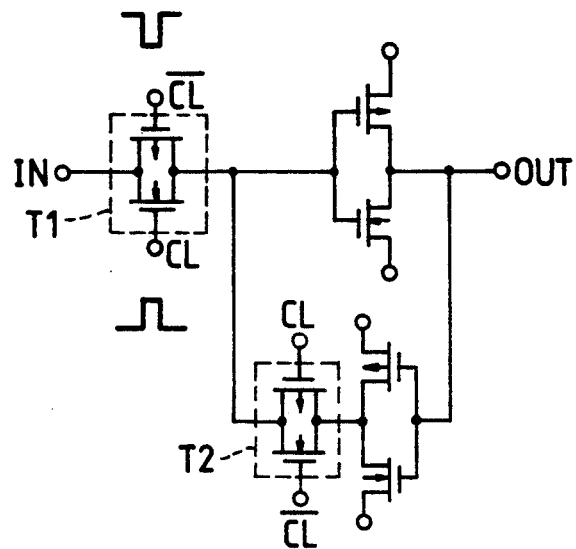
FIG. 38 is a circuit diagram of a CMOS latch circuit for use in the present invention.

FIG. 38 is a circuit diagram of a CMOS buffer (inverter) provided with the latch function. The CMOS buffer of this sort is used in various parts of CMOS static and dynamic RAMs and readily converted to a latch circuit.

In FIG. 38, a transfer gate T1 conducts when CL is switched to the high level and $\overline{CL}$ to the low level, whereas T2 becomes nonconductive. The signal supplied from the input terminal is inverted before being produced. When CL is switched to the low level and $\overline{CL}$ to the high level, T1 becomes nonconductive and T2 conductive, whereby the input signal is stopped, whereas the output is fed back. The flip flop thus formed causes the signal to be latched.

Figure 39:
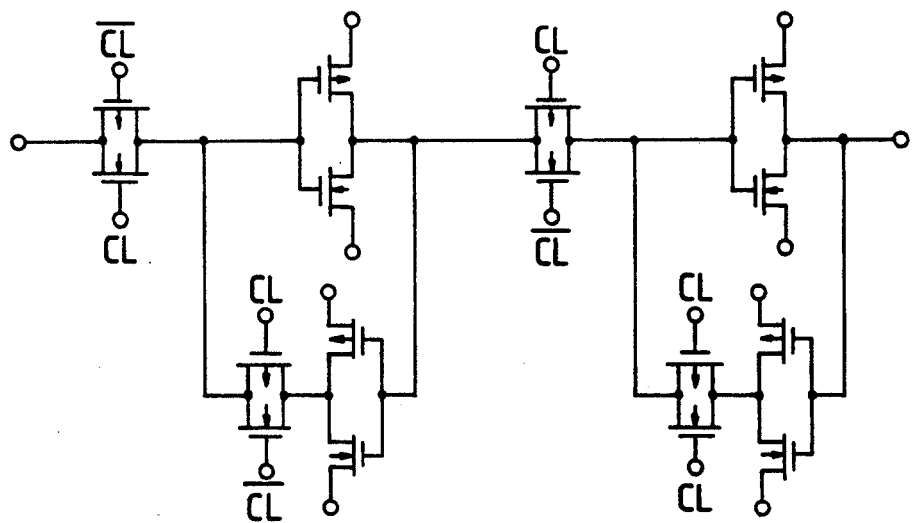
FIG. 39 is a circuit diagram a CMOS master-slave latch circuit for use in the present invention.

The latch circuit is easily convertible to the master-slave circuit in such a way as shown in FIG. 39.

FIG. 39 is a circuit diagram of the latch circuit of FIG. 38 converted to the master-slave circuit, wherein two stages of latch circuits are connected in series (cascade) and driven by clock signals in inverse phase (or complementary clock signals).

Figure 40:
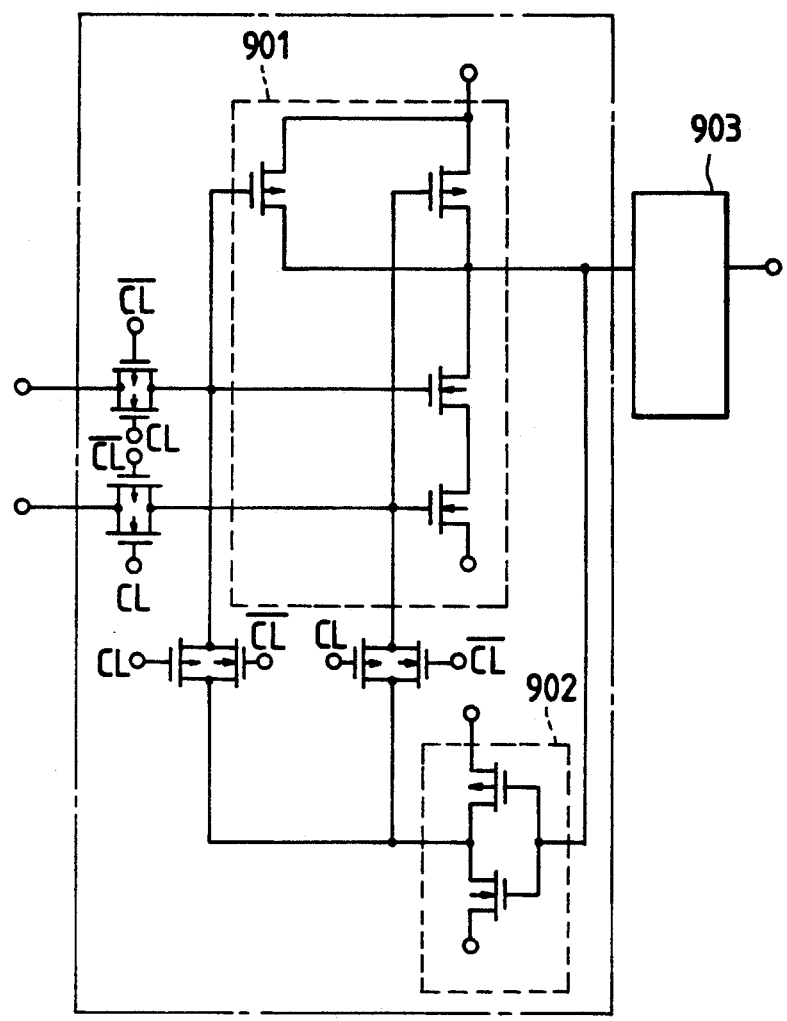
FIG. 40 is a circuit diagram of a CMOS gate converted to a master-slave latch circuit.

FIG. 40 is a circuit diagram CMOS NAND gate of the CMOS-type provided with the latch function. The NAND circuit is employed in the decoder circuit, the read/write control circuit or any one of the various circuits. The square portion 903 in FIG. 40 is a latch circuit to be converted to the master-slave circuit and similar to the latch circuit at the second half stage in FIG. 39. Various other gate circuits in the CMOS circuit are also provided with the latch function.

Figure 41:
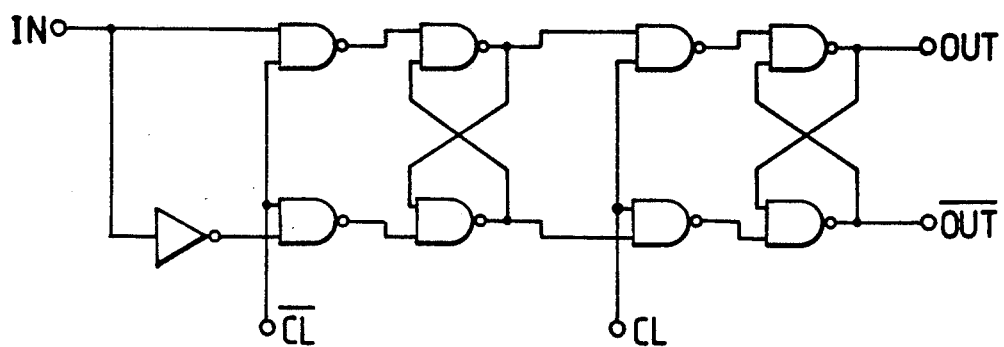
FIG. 41 is a circuit diagram of a CMOS master-slave latch circuit.

Needless to say, a latch circuit similar to the bipolar may be used in the CMOS circuit. FIG. 41 shows such an example and no transfer gates are used therein. In FIG. 41, a double input gate is, e.g. similar to 901 shown in FIG. 40, whereas the inverter is similar to 902 shown therein.

Figure 42:
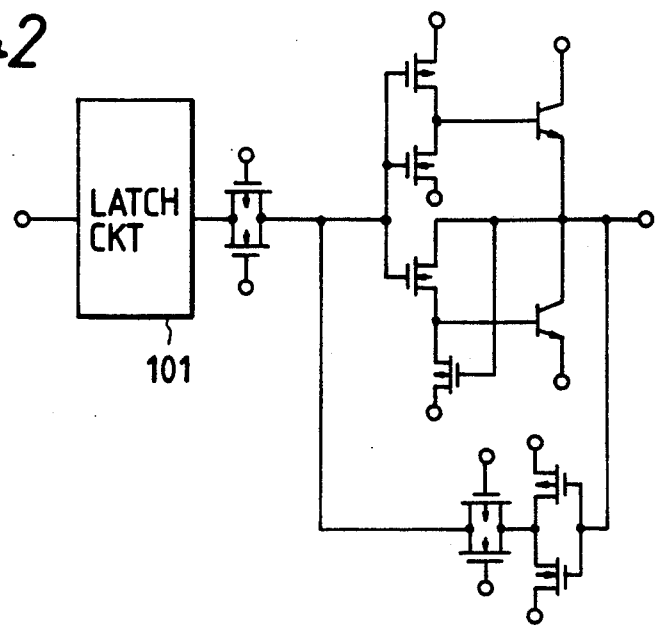
FIG. 42 is a circuit diagram of a BiCMOS master-slave latch circuit.

FIG. 42 is a circuit diagram of a BiCMOS master-slave latch circuit. The square portion 101 in FIG. 42 is the latch circuit of FIG. 38; it may be the gate latch circuit of FIG. 40 enclosed with an alternate long and short dash line.

Figure 43:
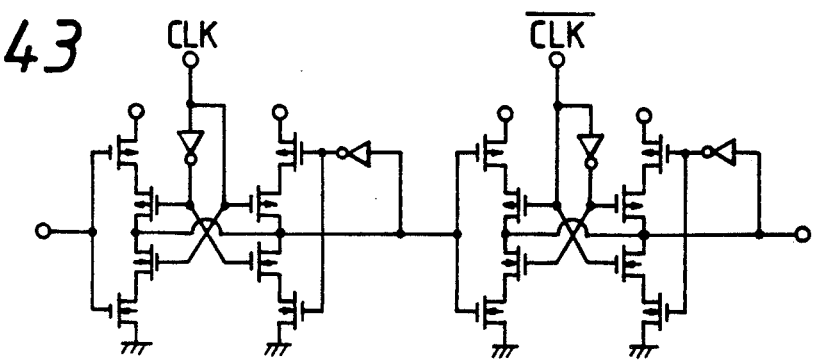
FIG. 43 is a circuit diagram of another CMOS master-slave latch circuit.

FIG. 43 is a circuit diagram of a master-slave latch circuit often favorably employed in a CMOS DRAM. A triangular inverter in this embodiment is similar to the circuit 902 of FIG. 40.

Figure 44:
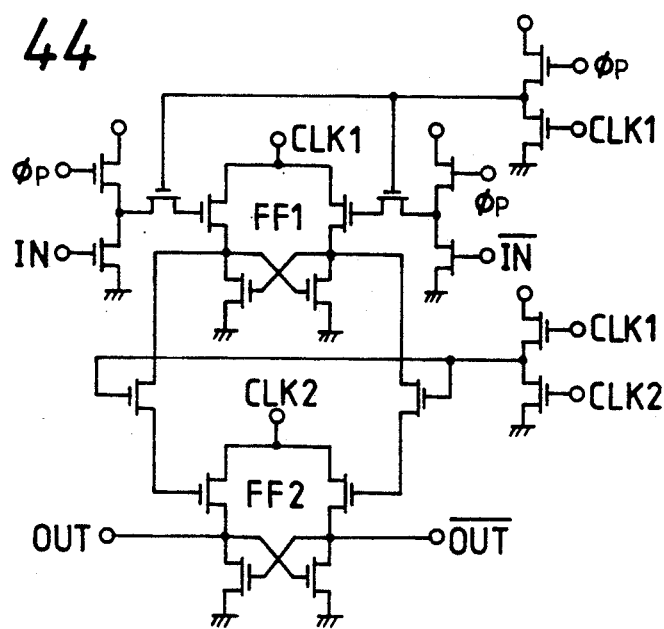
FIG. 44 is a circuit diagram of a dynamic latch circuit in a MOS - DRAM.

FIG. 44 is a circuit diagram of a dynamic latch circuit in a MOS - DRAM.

Figure 45:
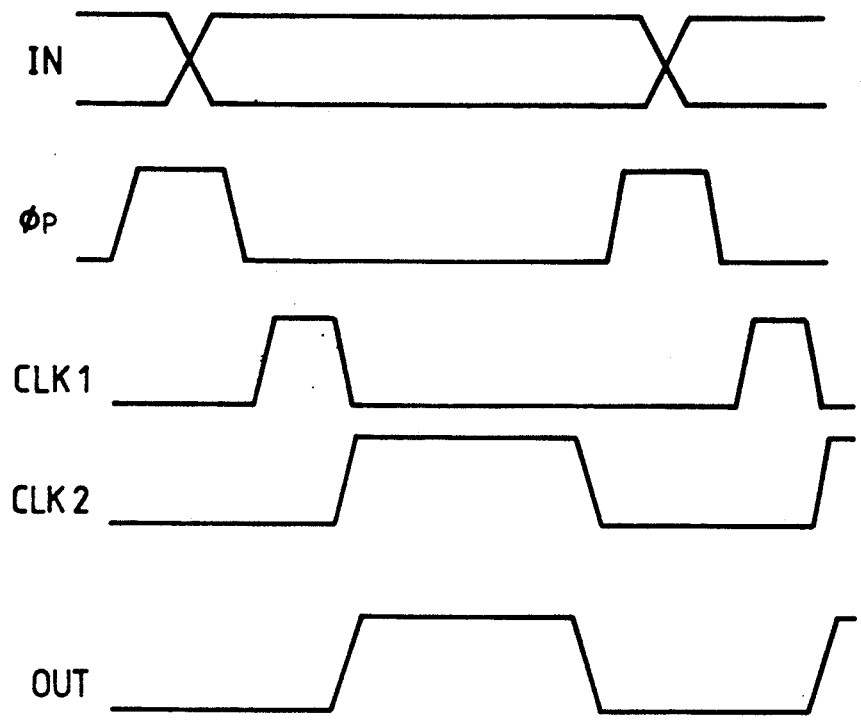
FIG. 45 is a pulse timing chart for use in driving the embodiment of FIG. 44.
Figure 48:
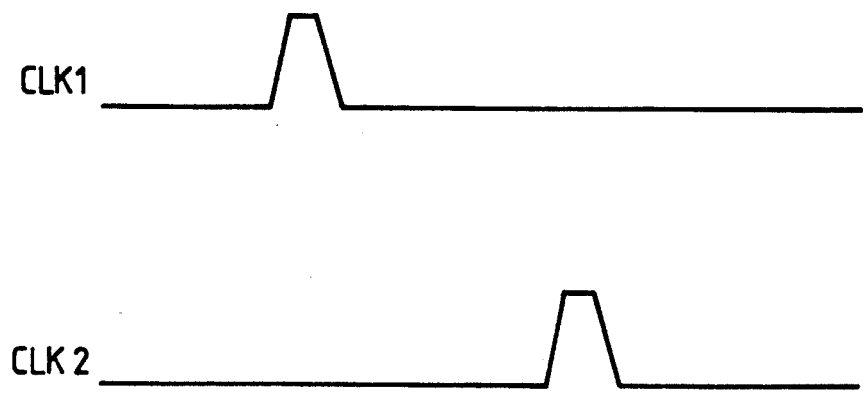
FIG. 48 is a diagram illustrating a clock signal for driving the embodiment of FIG. 47.

FIG. 45 is a waveform chart of signals CLK1, CLK2, $\phi p$ and input-output pulses for use in driving the circuit of this embodiment. The address input IN is taken into the flip flop FF1 according to the signal CLK1 and taken into the flip flop FF2 according to the signal CLK2 before being sent out. Then the desired node is precharged according to the precharge signal $\phi p$ and the following data input is prepared.

Figure 46:
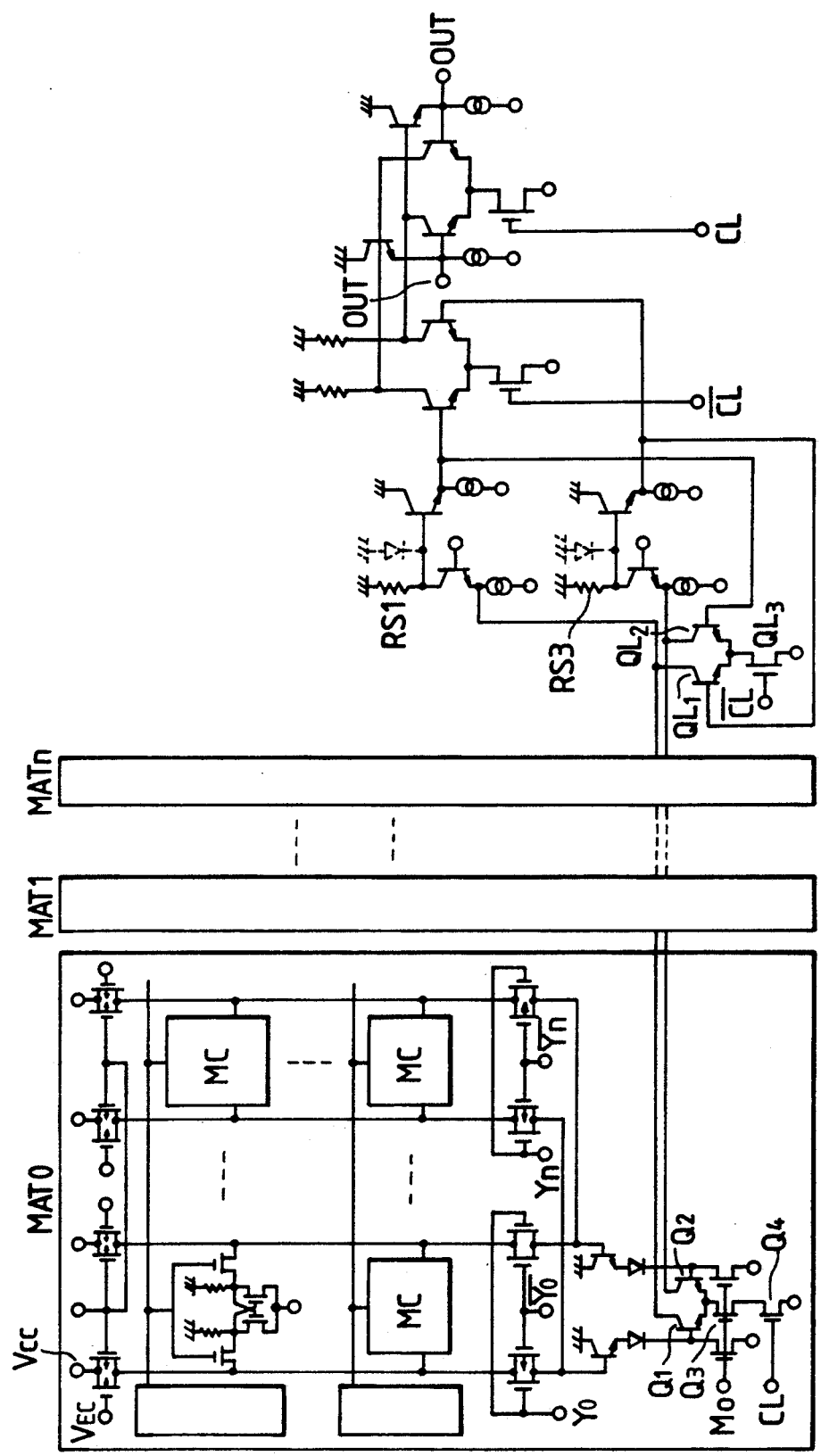
FIG. 46 is a circuit diagram of a master-slave latch circuit fit for use in the sense circuit of a BiCMOS memory.

FIG. 46 is a circuit diagram of a master-slave latch circuit fit for use as the sense circuit of a BiCMOS static RAM in the sense amplifier portion of the preamplifier or main amplifier in particular with the arrangement of a plurality of memory mats (mat 0-mat n) comprising the word line, the pair of digit lines, the memory, the preamplifier and the like. The operation of this circuit is closely similar to that of the sense circuit of FIG. 37. This sense circuit is also applicable to a BiCMOS - DRAM using a collector dot type sense circuit.

Although a description has been given of the master-slave latch circuit in the memory LSI, a number of latch circuits in the memory LSI may be driven according to a multiphase clock signal.

Figure 47:
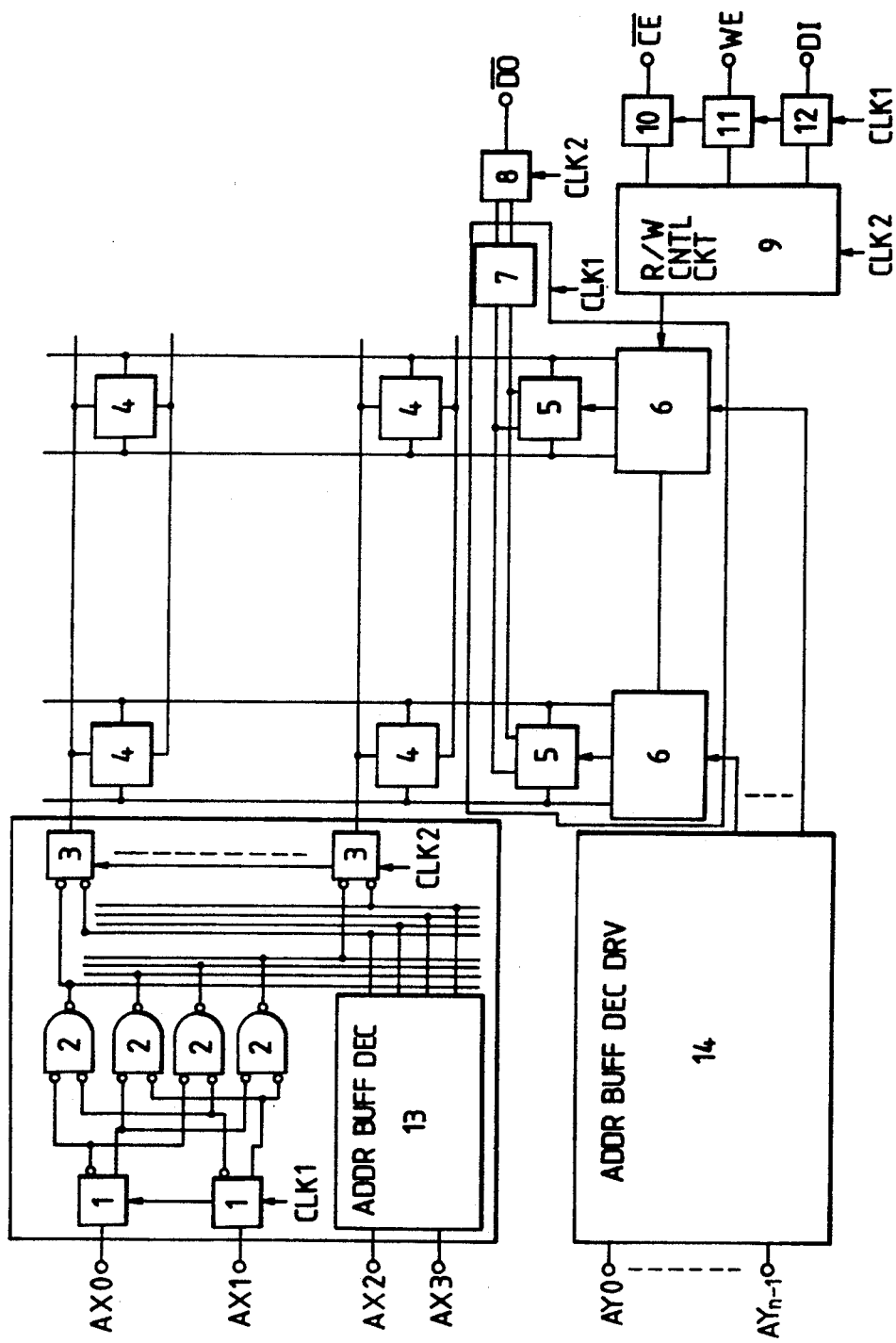
FIG. 47 is a block diagram of a 26th embodiment of the present invention using a multiphase clock signal.

FIG. 47 is a block diagram of the embodiment. The clocks CLK1 and CLK2 form, e.g. the multiphase clock signal providing clock signals with high levels that do not overlap. As the latch circuit, it may be a flip flop of any type starting with the convectional D-type flip flop (e.g. the latch circuits of FIGS. 34, 38). In this case, a stable memory is obtainable even when the clock cycle sharply changes.

In the case of this embodiment, the disadvantage is that clock formation is relatively more difficult than the master-slave case. However, the delay time is minimized since the two-stage latch circuit has not been employed as in the case of the master-slave latch circuit. In other words, the speed of this embodiment can readily be increased, compared with that of the master-slave latch circuit.

Although the two-phase clock signal has been exemplified in FIG. 47, a three-phase clock signal may, needless to say, be employed with the same effect.

Although a description has been given of the memory circuit mainly using the silicon semiconductor, the present invention is applicable to memory LSIs composed of semiconductors of those other than silicon such as semiconductors of III-V groups or devices other than semiconductors such as Josephson devices.

In the digital device using a pipelined memory having the plurality of latch circuits, the memory of the device may be operated according to the main clock signal to considerably increase the speed thereof by using the master-slave latch circuits as the plurality of latch circuits or driving these latch circuits according to the multiphase clock signal while driving the clock frequency toward the latch circuit by means of a frequency having the integer ratio of, e.g. 2:1 or 3:2 to the main clock signal (the integer ratio should be as high as possible to increase performance).

According to the present invention, the latch circuit in the memory LSI can be operated at high speed by providing the latch circuit with the master-slave function and driving the plurality of latch circuits according to the multiphase clock signal. Moreover, the memory LSI is capable of operating with stability, regardless of the clock frequency can be materialized even if the clock frequency is sharply changed.

The memory LSI using the digital device like this can be operated at high speed with stability.

It is further understood by those skilled in the art that the foregoing description is a preferred embodiment of the disclosed device and that various changes and modifications may be made in the invention without departing from the spirit and scope thereof.

What is claimed is:

1. A semiconductor device comprising a memory having the function of writing data to the memory cell designated by an address signal applied to an address input terminal according to write control signal applied to a write control signal input terminal and data supplied to a data input terminal, wherein a plurality of stages of latch circuits are provided in a signal path from the write control signal input terminal or data input terminal up to the memory cell, wherein the latch circuits of at least two stages are coupled in such a manner that the output signal of the latch circuit at the preceding stage is fed to the latch circuit at the following stage directly or indirectly via another circuit, and wherein the latch circuits at the preceding and the following stages have an inverse operating relationship in which control is effected by a pair of complementary clock signals in which one is the logic invert of the other or by a single clock signal so that with respect to each consecutive pair of latch circuits coupled one is placed in a hold-state ad the other in a through-state.

2. A semiconductor device according to claim 1 wherein each clock signal has an H level of a duration substantially equal to the duration thereof at an L level.

3. A semiconductor device according to claim 1, wherein the single clock signal is such that the duration of its H level is substantially equal to or greater than the delay time until the signal produced from the latch circuit, put to the through-state when it remains at the H level, reaches the latch circuit at the following stage, whereas it is such that the duration of its L level is substantially equal to or greater than the delay time until the signal produced from the latch circuit, put to the through-state when it remains at the L level, reaches the latch circuit at the following stage.

4. A semiconductor device comprising a memory having the function of writing data to the memory cell designated by an address signal applied to an address input terminal according to a write control signal applied to a write control signal input terminal and data supplied to a data input terminal, wherein a plurality of stages of latch circuits are provided in a signal path from the address input terminal up to the memory cell, another plurality of stages of latch circuits and equal in stage number to the former being provided in another signal path from the write control signal input terminal or data input terminal up to the memory cell, wherein the output signal in the latch circuit at the preceding stage is connected to the latch circuit at the following stage directly or indirectly via another circuit in each of the signal paths, wherein the latch circuits at the preceding and following stages are operated in inverse phase with each other and are controlled by a pair of complementary clock signals in which one is the logic invert of the other or by a single clock signal so that with respect to each consecutive pair of latch circuits one is placed in a hold state and the other in a through-state.

5. A semiconductor device according to claim 4, wherein each clock signal has an H level of a duration substantially equal to the duration thereof at an L level.

6. A semiconductor device according to claim 4, wherein the single clock signal is such that the duration of its H level is substantially equal to or greater than the delay time until the signal produced from the latch circuit, put to the through-state when it remains at the H level, reaches the latch circuit at the following stage, whereas it is such that the duration of its L level is substantially equal to or greater than the delay time until the signal produced from the latch circuit, put to the through-state when it remains at the L level, reaches the latch circuit at the following stage.

7. A semiconductor device comprising a digital device being a memory circuit comprising an address buffer including a latching function, a decoder, a driver including a latching function, a memory cell, a sense circuit, an output circuit, a read/write control circuit including a latching function, and using a memory LSI for providing latch circuits for effecting the latch function and driving them by means of a two-phase or multiphase clock signal, wherein the latching of the memory circuit is driven with a frequency which is integrally proportional to the main clock frequency of the memory circuit.

8. A semiconductor device comprising:
   a first circuit block including latch means for holding signals;
   a second circuit block including latch means for holding signals;
   a third circuit block including latch means for holding signals,
   wherein an input signal is fed to an input of said first circuit block, an output signal of said first circuit block is fed to an input of said second circuit block, and an output signal of said second circuit block is fed to an input of said third circuit block;
   a first clock signal for controlling the latch means of said first circuit block and said third circuit block; and
   a second clock signal for controlling the latch means of said second circuit block,
   wherein said first and second clock signals are complementary signals in which one is an inverted signal of the other and,
   wherein the latch means of both said first and said third circuit blocks are in a hold-state when the latch means of said second circuit block is in a through-state, and the latch means of both said first and said third circuit blocks are in a through-state when the latch means of said second circuit block is in a hold-state.

9. A semiconductor device according to claim 8, wherein
   said first circuit block is an address buffer circuit block;
   said second circuit block is a driver circuit block; and
   said third circuit block is a sense circuit block.

10. A semiconductor device according to claim 9, further comprising:
    an output circuit block including latch means for holding signals, wherein
    an output signal of said sense circuit block is fed to said output circuit block.

11. A semiconductor device according to claim 10, further comprising:
    a decoder circuit block having outputs respectively coupled to inputs of said driver circuit block and having inputs respectively coupled to outputs of said address buffer circuit, said decoder circuit block operating on signals provided by said address buffer circuit block in accordance with an input address; and
    a memory array block having inputs coupled to outputs of said driver circuit block and an output coupled to an input of said sense circuit block.

12. A semiconductor device according to claim 11, wherein said decoder circuit block, and said memory array block are comprised of logic gates; and
    wherein each latch means is comprised of at least one D-type flip flop having a data input, a clock input and a data output terminal.

13. A semiconductor device according to claim 11, wherein said decoder circuit block and said driver circuit block are comprised of emitter-coupled logic circuits provided with a latch function.

14. A semiconductor device according to claim 11, wherein each said latch means is comprised of a D-type flip flop having a data input, a clock input and a data output terminal.

15. A semiconductor device according to claim 8, wherein each said latch means is comprised of a D-type flip flop having a data input, a clock input and a data output terminal.

16. A semiconductor device comprising:
    a first circuit block including a master-slave type latch circuit for holding signals;
    a second circuit block including a master-slave type latch circuit for holding signals; and
    a third circuit block including a master-slave type latch circuit for holding signals,
    wherein said first circuit block, said second circuit block and said third circuit block are arranged to provide a pipeline operation in which an input signal is fed to said first circuit block, an output signal of said first circuit block is fed to an input of said second circuit block, and an output of said second circuit block is fed to an input of said third circuit block, and
    wherein the master-slave type latch circuits of said first, said second and said third circuit blocks are controlled by a same clock signal.

17. A semiconductor device according to claim 16, wherein said first circuit block is an address buffer circuit block;
    said second circuit block is a driver circuit block; and
    said third circuit block is a sense circuit block.

18. A semiconductor device according to claim 17, further comprising:
    an output circuit block including latch means for holding signals, wherein
    an output signal of said sense circuit block is fed to said output circuit block.

19. A semiconductor device according to claim 6, wherein said latch means of said output circuit block includes a master-slave type latch circuit.

20. A semiconductor device comprising:
    a first circuit block including a master-slave type latch circuit for holding signals;
    a second circuit block including a master-slave type latch circuit for holding signals; and
    a third circuit block including a master-slave type latch circuit for holding signals,
    wherein said first circuit block, said second circuit block and said third circuit block are arranged to provide a pipeline operation in which an input signal is fed to said first circuit block, an output signal of said first circuit block is fed to an input of said second circuit block, and an output of said second circuit block is fed to an input of said third circuit block, and
    wherein the master-slave type latch circuits of said first circuit block and said third circuit block are controlled by a first phase clock signal and the master-slave type latch circuit of said second circuit block is controlled by a second phase clock signal, the first and second phase clock signals are phase delayed signals generated internally in said device from a common clock signal.

21. A semiconductor device according to claim 20, wherein said first circuit block is an address buffer circuit block;
    said second circuit block is a driver circuit block; and
    said third circuit block is a sense circuit block.

22. A semiconductor device according to claim 21, further comprising:

an output circuit block including latch means for holding signals, wherein an output signal of said sense circuit block is fed to said output circuit block.

23. A semiconductor device according to claim 22, wherein said latch means of said output circuit block includes a master-slave type latch circuit.

24. A semiconductor device comprising:

a first circuit block including latch means for holding signals;

a second circuit block including latch means for holding signals;

a third circuit block including latch means for holding signals, wherein said first circuit block, said second circuit block and said third circuit block are arranged to provide a pipeline operation in which an input signal is fed to said first circuit block, an output signal of said first circuit block is fed to an input of said second circuit block, and an output of said second circuit block is fed to an input of said third circuit block; and a bi-level clock signal for controlling the latch means of each of said first, second and third circuit blocks, wherein the latch means of both said first and said third circuit blocks are activated in response to a first level of said clock signal and the latch means of said second circuit block is activated in response to a second level of said clock signal so that the latch means of said first and said third circuit blocks are in a hold-state when the latch means of said second circuit block is a through-state, and the latch means of said first and said third circuit blocks are in a through-state when the latch means of said second circuit block is in a hold-state.

25. A semiconductor device according to claim 24, wherein said first circuit block is an address buffer circuit block comprised of bistable circuits operating on the logic "1" level of a binary clock signal;

said second circuit block is a driver circuit block comprised of bistable circuits operating on the logic "0" level of said binary clock signal; and said third circuit block is a sense circuit block operating on the logic "1" level of said binary clock signal.

26. A semiconductor device according to claim 25, further comprising:

an output circuit block including latch means for holding signals, wherein an output signal of said sense circuit block is fed to said output circuit block.

27. A semiconductor device according to claim 26, wherein the latch means of said output circuit block is activated in response to the second binary level of said clock signal.

28. A semiconductor device according to claim 24, wherein the clock signal has an H level of a duration substantially equal to the duration thereof at an L level.

29. A semiconductor device according to claim 24, wherein the clock signal is such that the duration of its first level is substantially equal to or greater than the delay time until the signal produced from the latch circuit, put to the through-state when the clock signal is at the first level, reaches the latch circuit at the following stage, whereas it is such that the duration of its second level is substantially equal to or greater than the delay time until the signal produced form the latch circuit, put to the through-state when the clock signal is at the second level, reaches the latch circuit at the following stage.

* * * * *